US012564043B2

(12) United States Patent
Chiu et al.

(10) Patent No.: US 12,564,043 B2
(45) Date of Patent: Feb. 24, 2026

(54) MANUFACTURING METHOD FOR SEMICONDUCTOR DEVICE

(71) Applicant: TAIWAN SEMICONDUCTOR MANUFACTURING COMPANY, LTD., Hsinchu (TW)

(72) Inventors: Te-Hsin Chiu, Hsinchu (TW); Wei-An Lai, Hsinchu (TW); Meng-Hung Shen, Hsinchu (TW); Wei-Cheng Lin, Hsinchu (TW); Jiann-Tyng Tzeng, Hsinchu (TW); Kam-Tou Sio, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 345 days.

(21) Appl. No.: 18/156,752

(22) Filed: Jan. 19, 2023

(65) Prior Publication Data

US 2023/0154846 A1      May 18, 2023

Related U.S. Application Data

(62) Division of application No. 17/123,664, filed on Dec. 16, 2020, now Pat. No. 11,569,166.
(Continued)

(51) Int. Cl.
*H01L 23/528* (2006.01)
*H01L 21/768* (2006.01)
*H01L 23/522* (2006.01)

(52) U.S. Cl.
CPC ...... *H01L 23/528* (2013.01); *H01L 21/76802* (2013.01); *H01L 21/76831* (2013.01); *H01L 21/76877* (2013.01); *H01L 23/5226* (2013.01)

(58) Field of Classification Search
CPC ......... H01L 23/53295; H01L 23/53238; H01L 23/528; H01L 21/76832; H01L 21/76802
See application file for complete search history.

(56) References Cited

U.S. PATENT DOCUMENTS 9,991,200 B2      6/2018  Ting et al.
11,209,876 B1    12/2021  Chen
(Continued)

FOREIGN PATENT DOCUMENTS

CN        110827685        2/2020

OTHER PUBLICATIONS

Office Action dated Aug. 11, 2021 for corresponding application No. TW 11020778900. (pp. 1-6).

*Primary Examiner* — Zandra V Smith
*Assistant Examiner* — John M Parker
(74) *Attorney, Agent, or Firm* — Hauptman Ham, LLP

(57) ABSTRACT

A method of making a semiconductor structure includes defining a first recess in an insulation layer. The method further includes forming a protection layer along a sidewall of the first recess. The method further includes forming a first conductive line in the first recess and in direct contact with the protection layer. The method further includes depositing a first insulation material over the first conductive line. The method further includes defining a second recess in the first insulation material. The method further includes forming a second conductive line in the second recess. The method further includes forming a via extending from the second conductive line, wherein the via directly contacts a sidewall of the protection layer.

20 Claims, 47 Drawing Sheets

Related U.S. Application Data

(60)  Provisional application No. 63/072,513, filed on Aug. 31, 2020.

(56)                      References Cited

U.S. PATENT DOCUMENTS

| | | |
|---|---|---|
| 2013/0285257 A1 | 10/2013 | Lee |
| 2014/0134836 A1 | 5/2014 | Pranatharthiharan et al. |
| 2014/0159169 A1* | 6/2014 | Xie ..................... H10D 64/517 |
| | | 438/589 |
| 2016/0379871 A1 | 12/2016 | Tsai et al. |
| 2017/0117272 A1 | 4/2017 | Sio et al. |
| 2017/0229341 A1 | 8/2017 | Chang et al. |
| 2019/0067189 A1 | 2/2019 | Wee et al. |
| 2019/0164996 A1 | 5/2019 | Wang et al. |
| 2019/0206893 A1 | 7/2019 | Liaw |
| 2019/0363048 A1 | 11/2019 | Zhao et al. |
| 2020/0075460 A1 | 3/2020 | Hu et al. |
| 2020/0350206 A1 | 11/2020 | Ren et al. |
| 2022/0082612 A1 | 3/2022 | Hu et al. |

* cited by examiner

200

200

1000

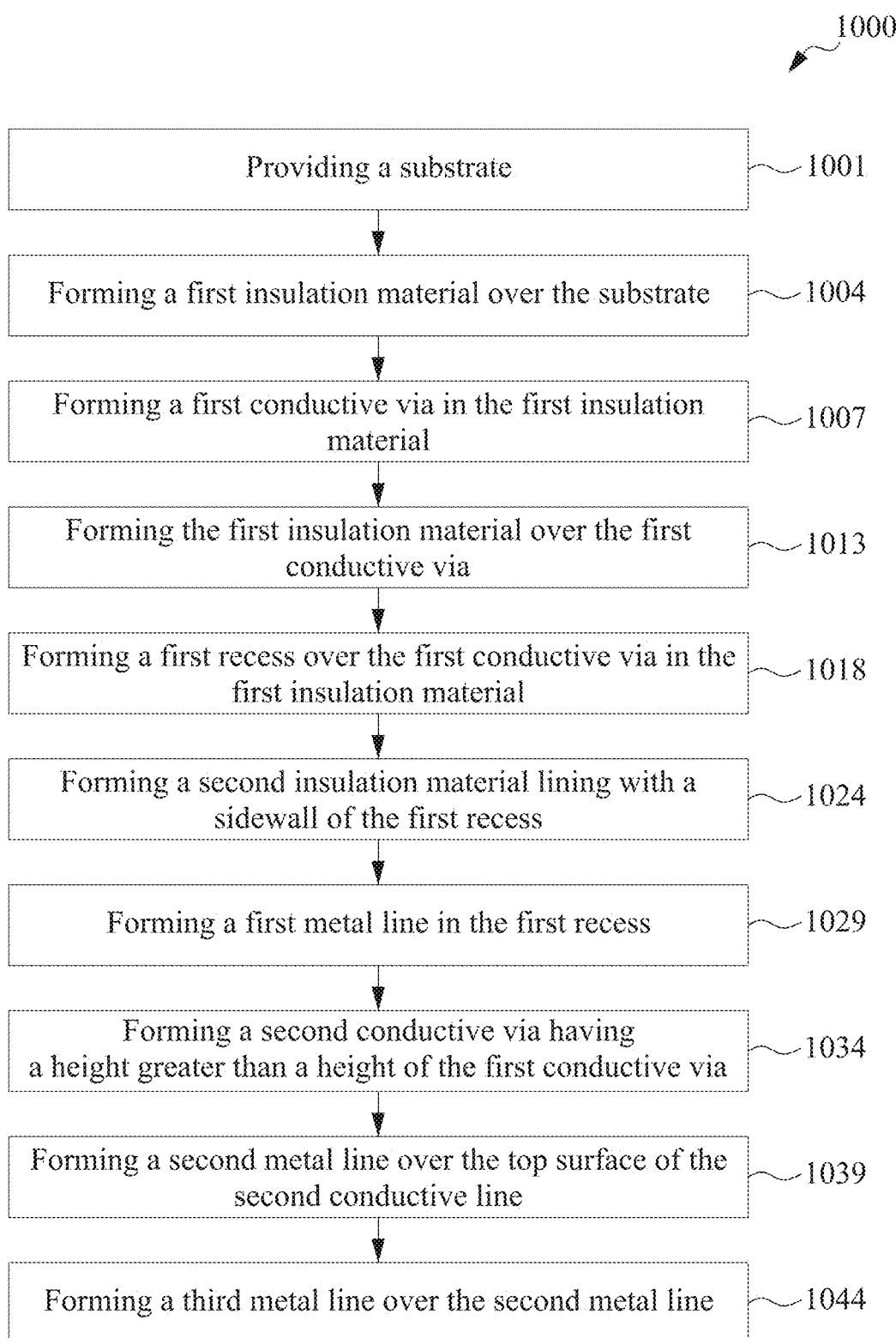

Providing a substrate — 1001

Forming a first insulation material over the substrate — 1004

Forming a first conductive via in the first insulation material — 1007

Forming the first insulation material over the first conductive via — 1013

Forming a first recess over the first conductive via in the first insulation material — 1018

Forming a second insulation material lining with a sidewall of the first recess — 1024

Forming a first metal line in the first recess — 1029

Forming a second conductive via having a height greater than a height of the first conductive via — 1034

Forming a second metal line over the top surface of the second conductive line — 1039

Forming a third metal line over the second metal line — 1044

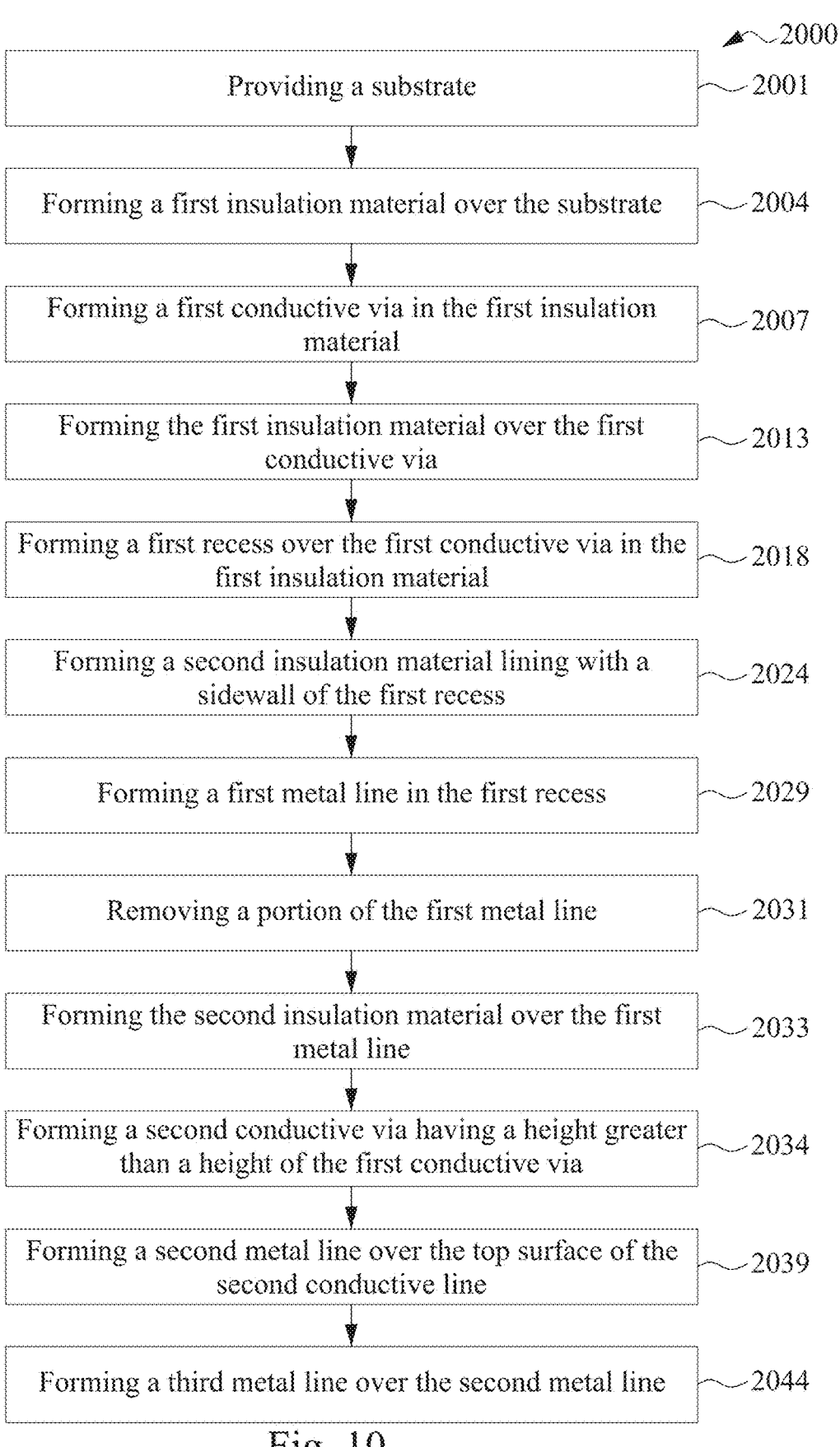

~2000

Providing a substrate — 2001

Forming a first insulation material over the substrate — 2004

Forming a first conductive via in the first insulation material — 2007

Forming the first insulation material over the first conductive via — 2013

Forming a first recess over the first conductive via in the first insulation material — 2018

Forming a second insulation material lining with a sidewall of the first recess — 2024

Forming a first metal line in the first recess — 2029

Removing a portion of the first metal line — 2031

Forming the second insulation material over the first metal line — 2033

Forming a second conductive via having a height greater than a height of the first conductive via — 2034

Forming a second metal line over the top surface of the second conductive line — 2039

Forming a third metal line over the second metal line — 2044

MANUFACTURING METHOD FOR SEMICONDUCTOR DEVICE

CROSS REFERENCE TO RELATED APPLICATIONS

This application is a divisional of U.S. patent application Ser. No. 17/123,664, filed Dec. 16, 2020, now U.S. Pat. No. 11,569,166, issued Jan. 31, 2023, which claims priority to Provisional Application Ser. No. 63/072,513, filed Aug. 31, 2020, which are herein incorporated by reference in their entireties.

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component or line that can be created using a fabrication process) has decreased. This scaling-down process generally provides benefits by increasing production efficiency and lowering associated costs.

However, since feature sizes continue to decrease, fabrication processes continue to become more difficult to perform and the critical dimension uniformity of components (or lines) continues to become more difficult to control. For example, decreasing the distance between two vias that is at the same level is difficult. Electrical short is also a jarring issue that hinders the path to realize the minimization of smaller criticality. Forming reliable semiconductor devices at smaller and smaller sizes is challenging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 6 shows a flow chart of a method for fabricating a semiconductor structure, in accordance with some embodiments of the present disclosure.

FIG. 10 shows a flow chart of a method for fabricating a semiconductor structure, in accordance with some embodiments of the present disclosure.

DETAILED DESCRIPTION

Figure 1A:
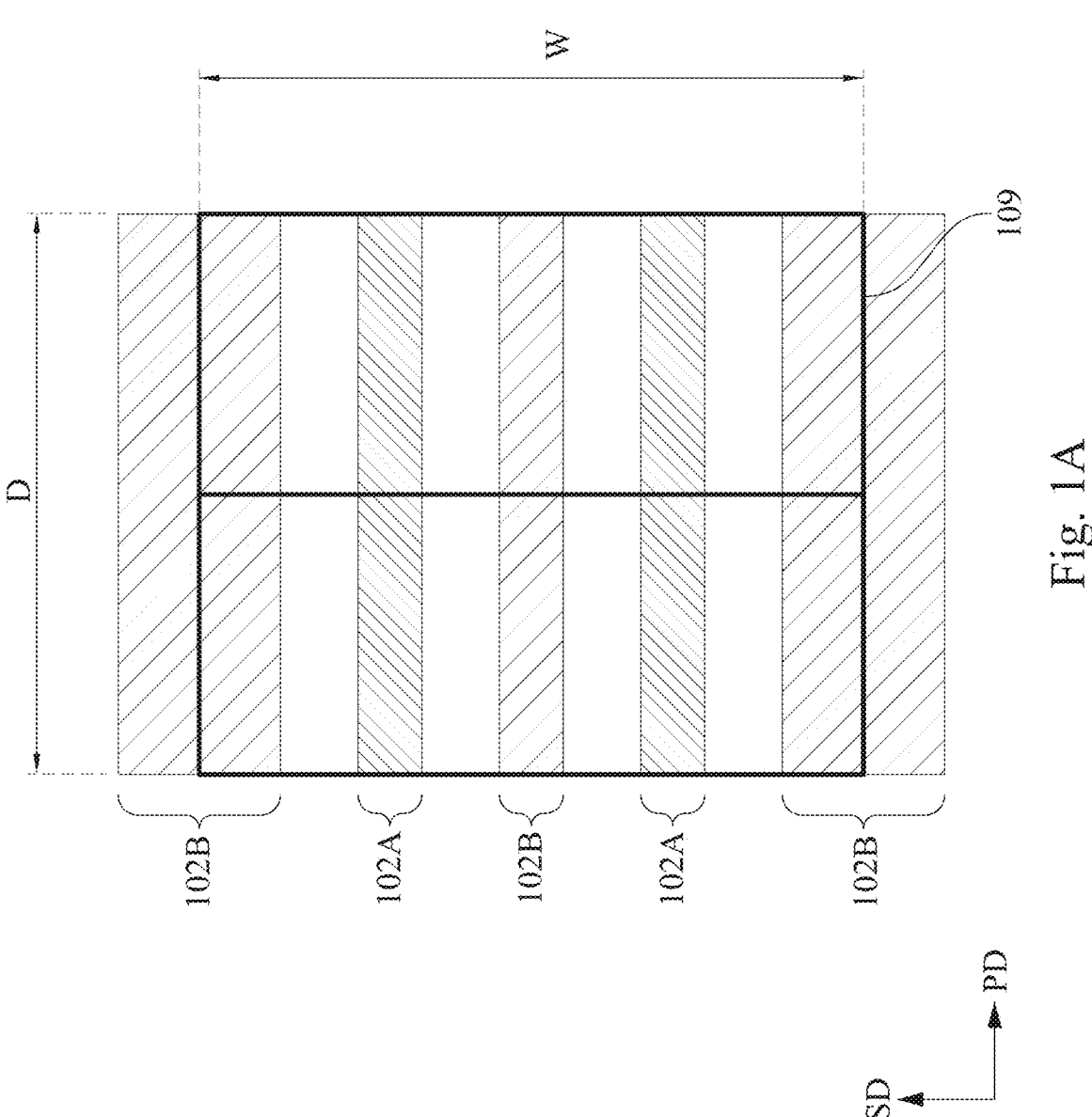
FIG. 1A is a top view of a semiconductor structure, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately," or "about" generally means within a value or range which can be contemplated by people having ordinary skill in the art. Alternatively, the terms "substantially," "approximately," or "about" means within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately," or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

With the trend of scaling down the geometry size of semiconductor devices, a cell height is able to be reduced by reducing pitches between conductive vias, thereby the device density can be increased. However, in some instances, issues with regard to resistance and parasitic capacitance occur when merely reducing the pitch between vias, which reduces device performance and operation speed. Furthermore, due to reduced pitches via complying with the restrictions of techniques of forming vias (such as lithography operations or etching operations, et cetera), a via physically contacts another adjacent via, which increases a risk of electrical short.

The present disclosure provides semiconductor structures and methods in order to address to aforementioned issues. Particularly, some embodiments of the routing of metal lines across multiple layers with the fashion of scaling down the geometry size of semiconductor devices in advanced technology nodes are discussed in FIG. 1A to FIG. 3. For example, some of the embodiments of the present disclosure provide semiconductor structures that include "staggered vias structures", which refers to more than one levels of metal lines are disposed in one insulation layer (i.e., one metal layer), wherein vias with different heights are connected from the bottoms of the multi-level metal lines to a common structure, such as substrate, conductive region, or underlying metal line extending in orthogonal direction. In some embodiments, the term "stagger" refers to the alternating configuration of two elements along a direction or can be observed in a certain perspective.

Some embodiments further utilize a protection layer to protect the metal lines and help to alleviate the issue of metal line undesirably connected to adjacent vias. This technique is applicable to the aforementioned staggered vias structures for addressing aforementioned issues. For example, embodiments with a protection layer lining on a sidewall of a metal line are discussed in FIG. 4A to FIG. 7G; and embodiments with a protection layer lining on a sidewall of a metal line and further includes a top portion extending over a top portion of the metal line are discussed in FIG. 8A to FIG. 11S. Furthermore, embodiments with an auxiliary via connecting multi-level metal lines in one metal layer are discussed in FIG. 12A to FIG. 12B. The techniques discussed in FIG. 4A to FIG. 7G, FIG. 8A to FIG. 11S, or FIG. 12A to FIG. 12B are applicable to the embodiments discussed in FIG. 1A to FIG. 3 or similar configuration, especially in the back end of line (BEOL) process.

One of ordinary skill in the art would understand that, the semiconductor structures discussed in the present disclosure refer to the metal layers proximal to conductive region (for example, M0 to M2), which often faces most difficult issues with regard to routing, however the techniques discussed in the present disclosure are also applicable to other metal layers. The techniques discussed in FIG. 4A to FIG. 7G, FIG. 8A to FIG. 11S, or FIG. 12A to FIG. 12B coexist and utilized across different metal layers in one device, in some embodiments.

In addition, the semiconductor structures discussed in the present disclosure provide the flexibility for design rule, where the electric characteristics (such as resistivity or parasitic capacitance) are tunable or adjustable according to specific requirement. For example, in some embodiments, a power device is designed to have lower resistivity, wherein some trade-off between resistivity and parasitic capacitance is achievable in some of the cases.

Figure 1B:
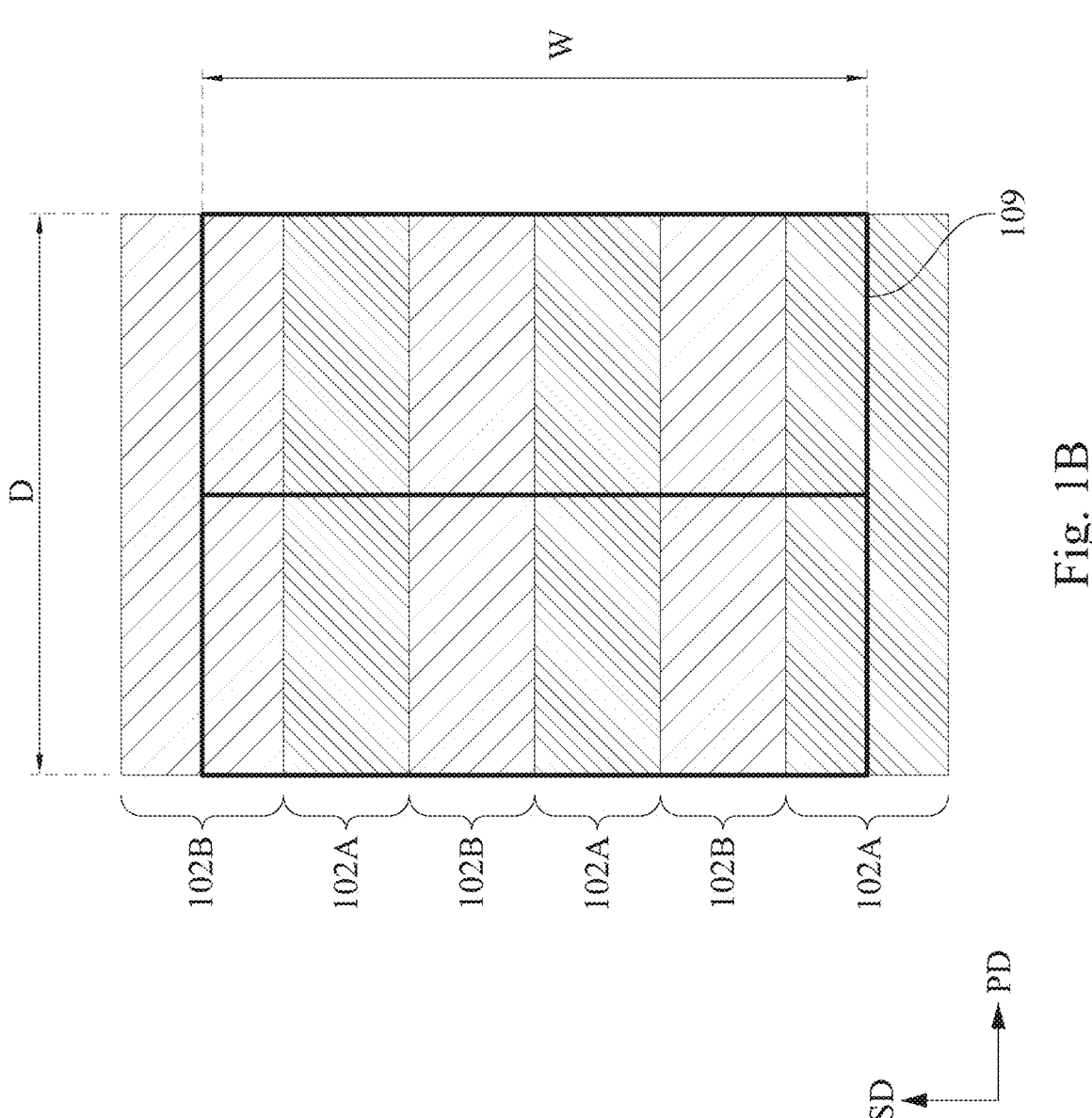
FIG. 1B is a top view of a semiconductor structure, in accordance with some embodiments of the present disclosure.
Figure 1C:
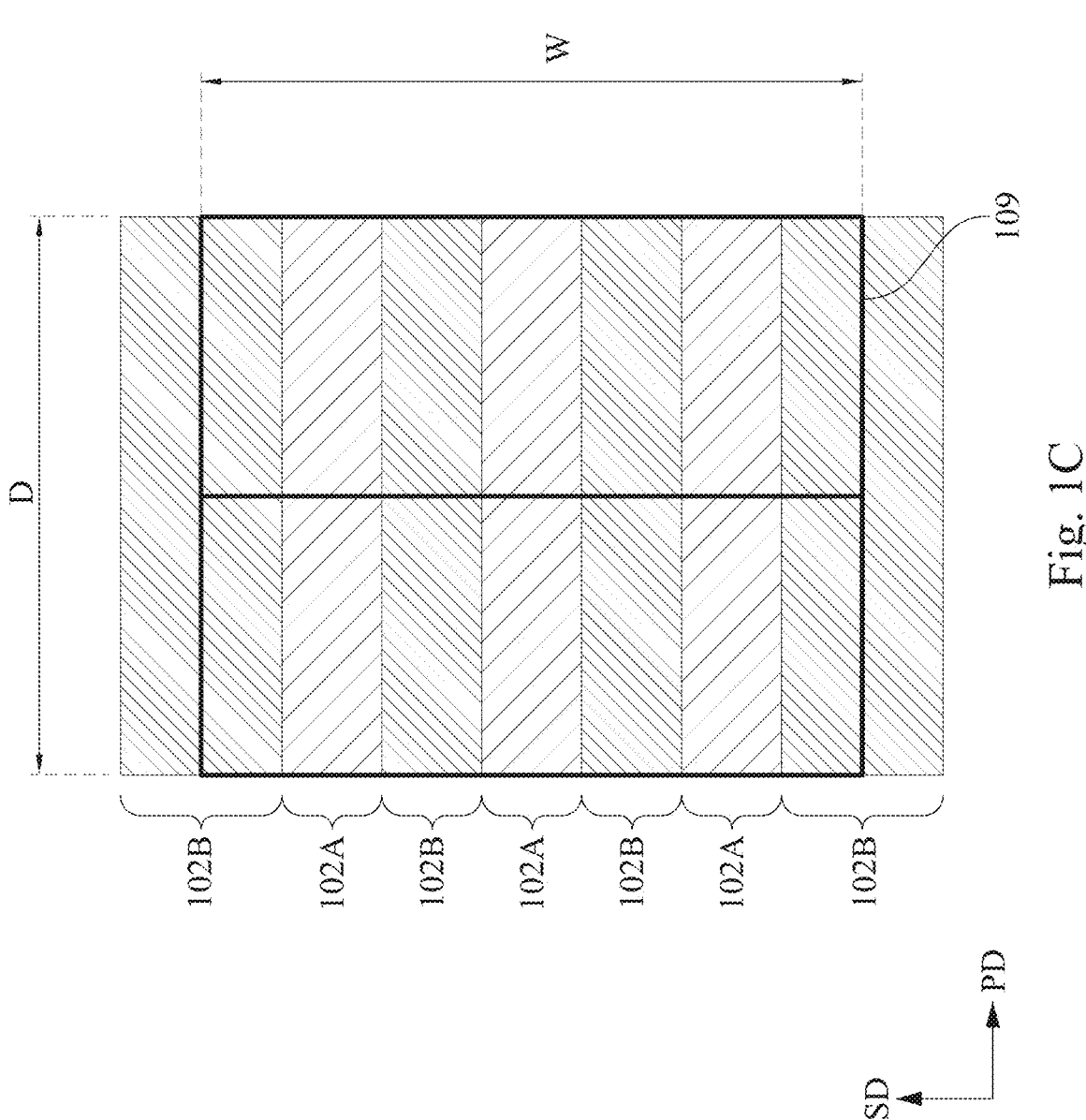
FIG. 1C is a top view of a semiconductor structure, in accordance with some embodiments of the present disclosure.

Referring to FIG. 1A to FIG. 1C, each of FIG. 1A, FIG. 1B and FIG. 1C is a top view of a semiconductor structure, according to some embodiments of the present disclosure. As previously discussed, with the trend of scaling down the geometry size of semiconductor devices, a size of a cell 100 is shrunk to certain extent in order to comply with certain technology node. For example, in some embodiments, the cell 100 has a cell width D along a primary direction PD and a cell height W along a secondary direction SD orthogonal to the primary direction PD. The cell 100 includes a gate region 109 extending along the secondary direction SD and has a length identical to the cell height W.

The cell 100 includes one or more first metal lines 102A and one or more second metal lines 102B extending along primary direction PD, wherein both first metal lines 102A and the second metal lines 102B are in the same metal layer. In some of the embodiments, both of first metal lines 102A and the second metal lines 102B are disposed in the lowest metal layer M0, however, the present disclosure is not limited thereto. FIG. 1A, FIG. 1B and FIG. 1C respectively shows embodiments of having three, four, and five entire metal lines (i.e., excluding partial ones) arranged side by side along the secondary direction SD. Taking the cell 100 in FIG. 1A as an example, one entire second metal line 102B and two entire first metal lines 102A are in the region of cell 100. Similarly, cell 100 shown in FIG. 1B includes two entire first metal lines 102A and two entire second metal lines 102B, and cell 100 shown in FIG. 1C includes three entire first metal lines 102A and two entire second metal lines 102B. More metal lines within the area of a cell 100 with similarly configurations can also be applied.

Having more metal lines in the cell 100 offers a benefit of increasing device density, however, further reducing the cell height W of the cell 100 with the trend of scaling down the size is challenging with regard to issues of resistance, parasitic capacitance and/or electrical short.

Figure 2A:
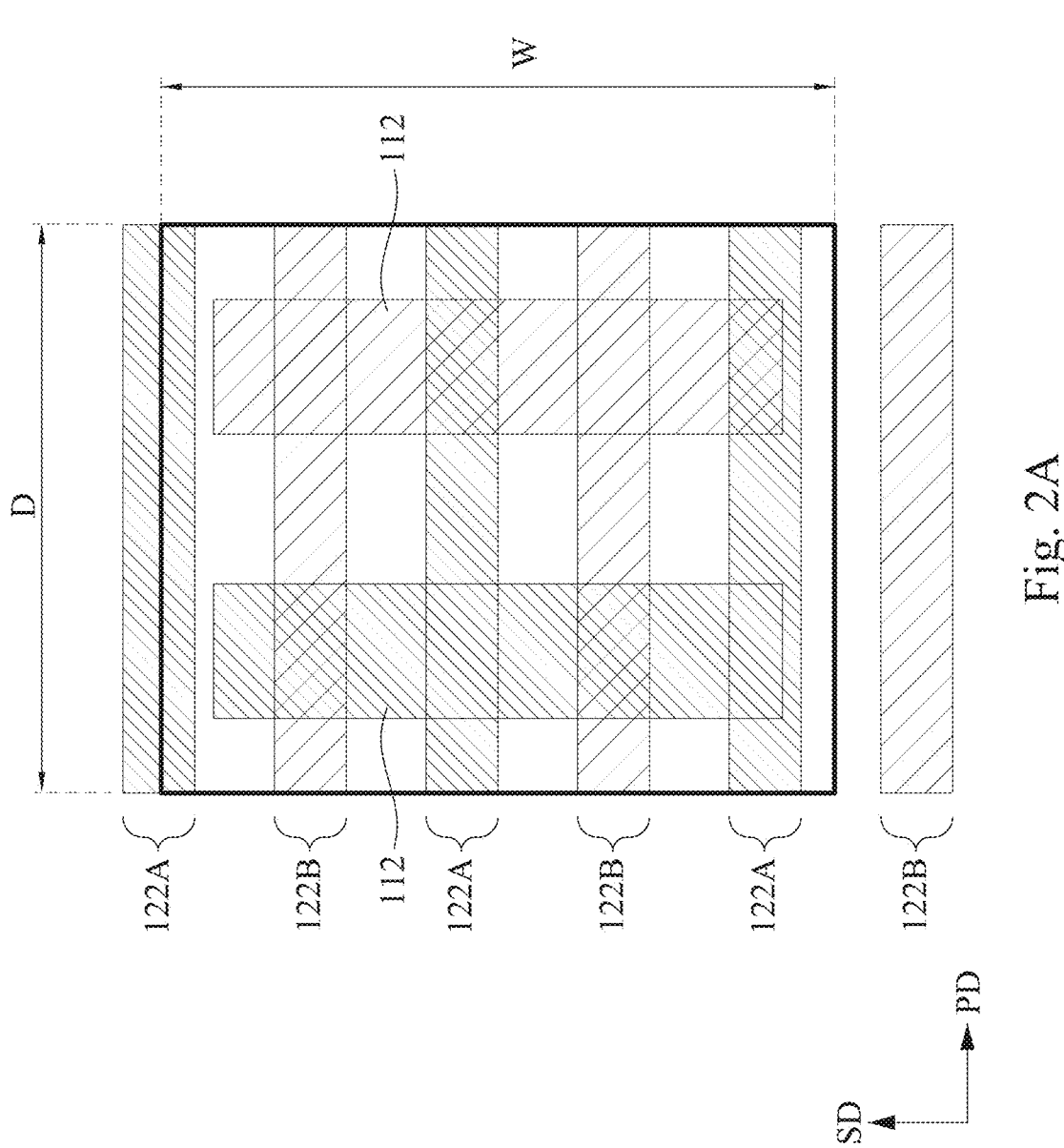
FIG. 2A is a top view of a semiconductor structure, in accordance with some embodiments of the present disclosure.
Figure 2B:
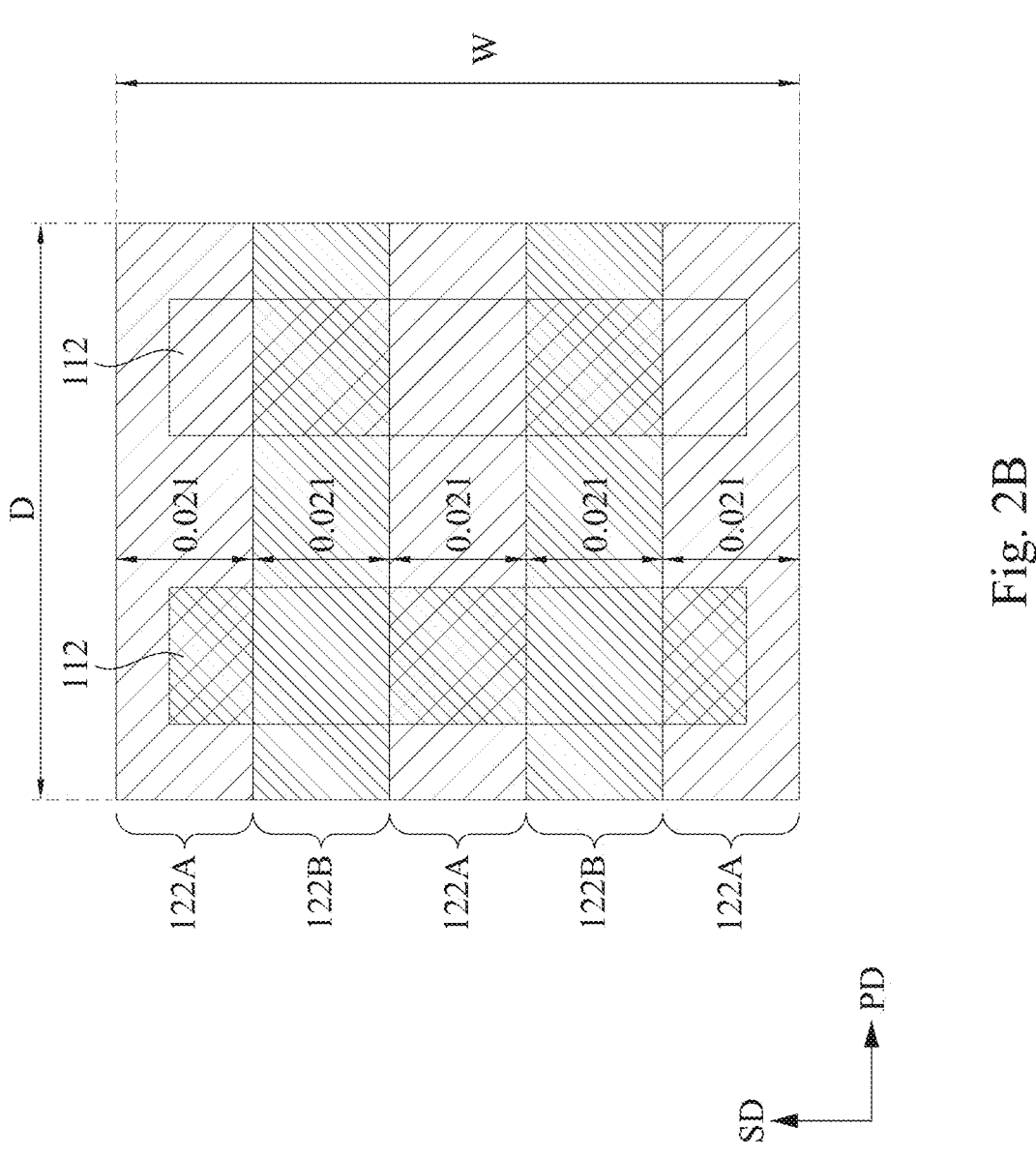
FIG. 2B is a top view of a semiconductor structure, in accordance with some embodiments of the present disclosure.

Referring to FIG. 2A to FIG. 2B, each of FIG. 2A and FIG. 2B is a top view of a semiconductor structure, according to some embodiments of the present disclosure. FIG. 2A and FIG. 2B shows the metal lines directly above and electrically connected to the first metal line(s) 102A and the second metal line(s) 102B discussed in FIG. 1A to FIG. 1C, or similar configuration. Specifically, FIG. 2A shows the embodiments of having a third metal line 112 extending along the secondary direction SD and four entire fourth metal lines 122A and fifth metal lines 122B above the third metal line 112 and extending along the primary direction. FIG. 2B shows the embodiments of having a third metal line 112 extending along the secondary direction SD and five entire fourth metal lines 122A and fifth metal lines 122B above the third metal line 112 and extending along the primary direction. However, increasing more metal lines in a cell area would face the challenge of reduced landing area for each underlying metal lines (such as the first metal lines 102A and the second metal lines 102B), and the higher density of conductive structures may face the challenge of resistivity, parasitic capacitance, or electrical short.

Figure 3:
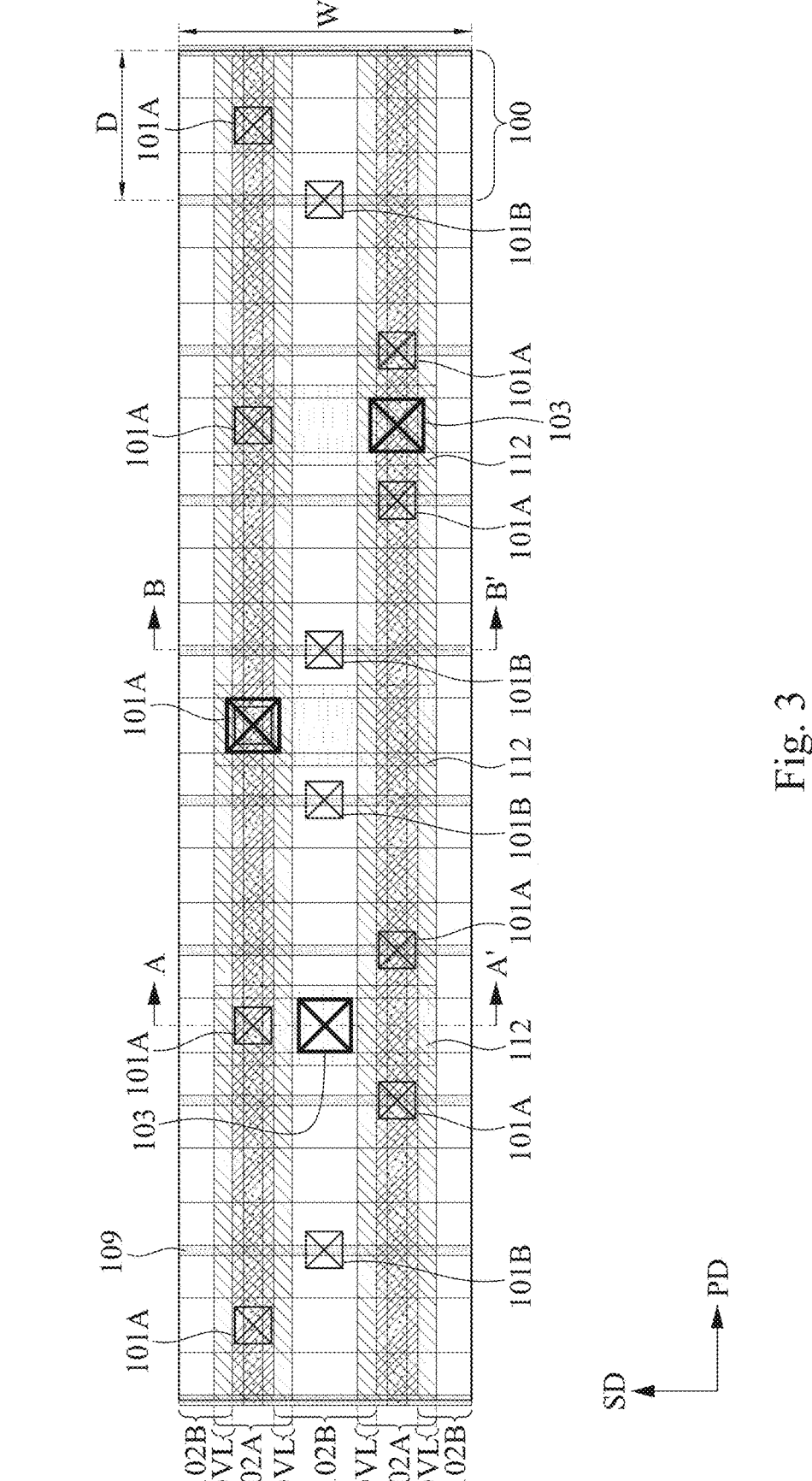
FIG. 3 is a top view of a semiconductor structure, in accordance with some embodiments of the present disclosure.

Referring to FIG. 3, FIG. 3 is a top view of a semiconductor structure, in accordance with some embodiments of the present disclosure. A semiconductor structure 100S including a plurality of cells 100. In order to increase the quantity of metal lines extending in primary direction PD in a cell area, which is defined by the boundary of gate region 109 and has a cell width D along the primary direction PD and a cell height W the secondary direction SD, the "staggered vias structures" as discussed subsequently are utilized. Specifically, the first metal lines 102A and the second metal lines 102B are disposed in a same metal layer (for example, M0 layer) but at different height levels. In some embodiments, each of the first metal lines 102A are at a first level and each of the second metal lines 102B are disposed at a second level above the first level. Furthermore, a portion of the first metal lines 102A overlaps with a portion of the second metal lines 102B in a vertical direction. The overlapped area OVL extends along the primary direction PD. In some embodiments, a cell area 100 includes more than one overlapped area OVL.

The semiconductor structure 100S includes a plurality of first vias 101A electrically connected to a bottom of the first metal lines 102A and a plurality of second vias 101B electrically connected to a bottom of the second metal lines 102B. The semiconductor structure 100S further includes the third metal line 112 above and orthogonal to the first metal lines 102A and the second metal lines 102B, and a third via 103 connected between the third metal line 112 and the second metal lines 102B or the first metal lines 102A.

Figure 11A:
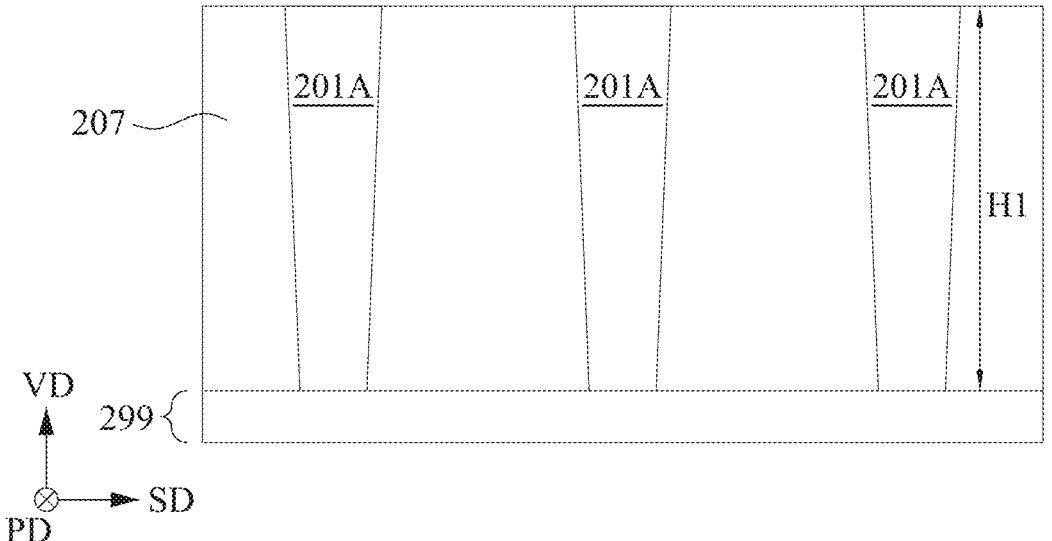
FIG. 11A to FIG. 11S are cross sectional views of a semiconductor structure during intermediate stages of manufacturing operations, according to some embodiments of the present disclosure.
Figure 11B:
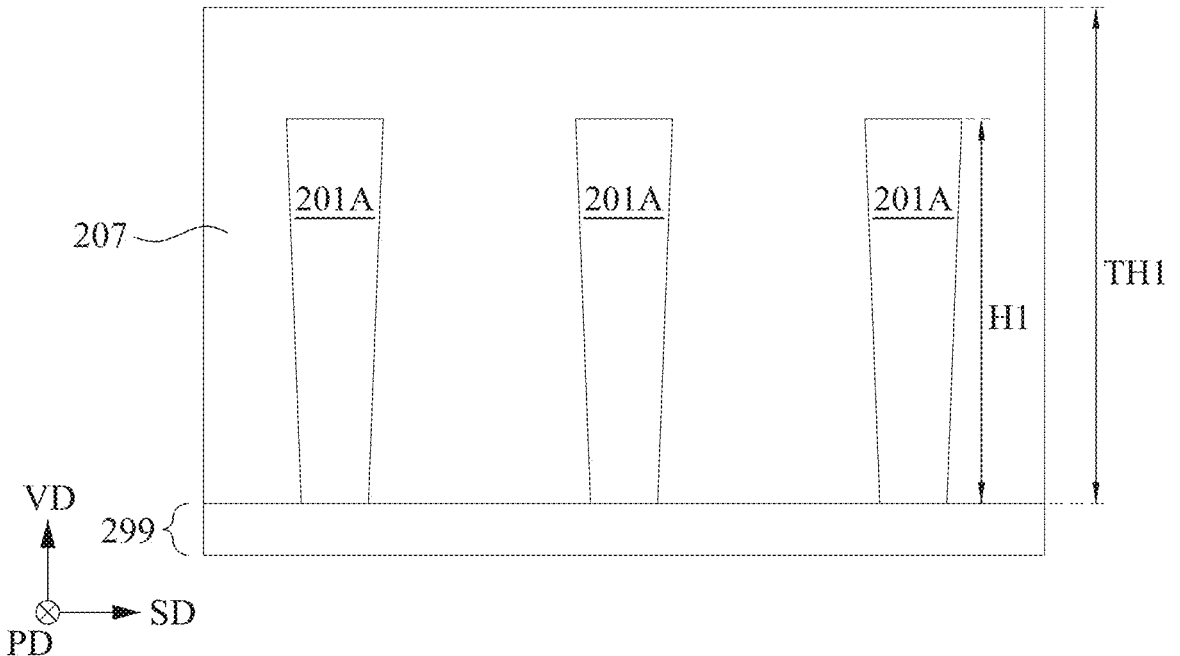
Figure 11C:
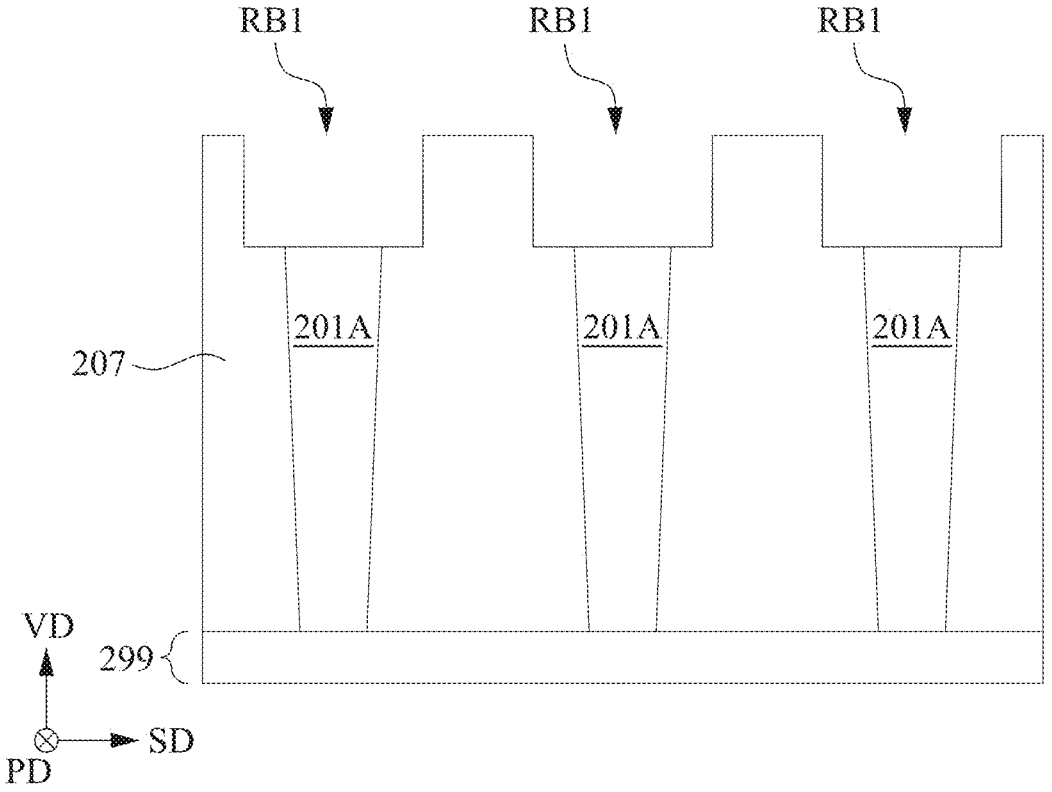
Figure 11D:
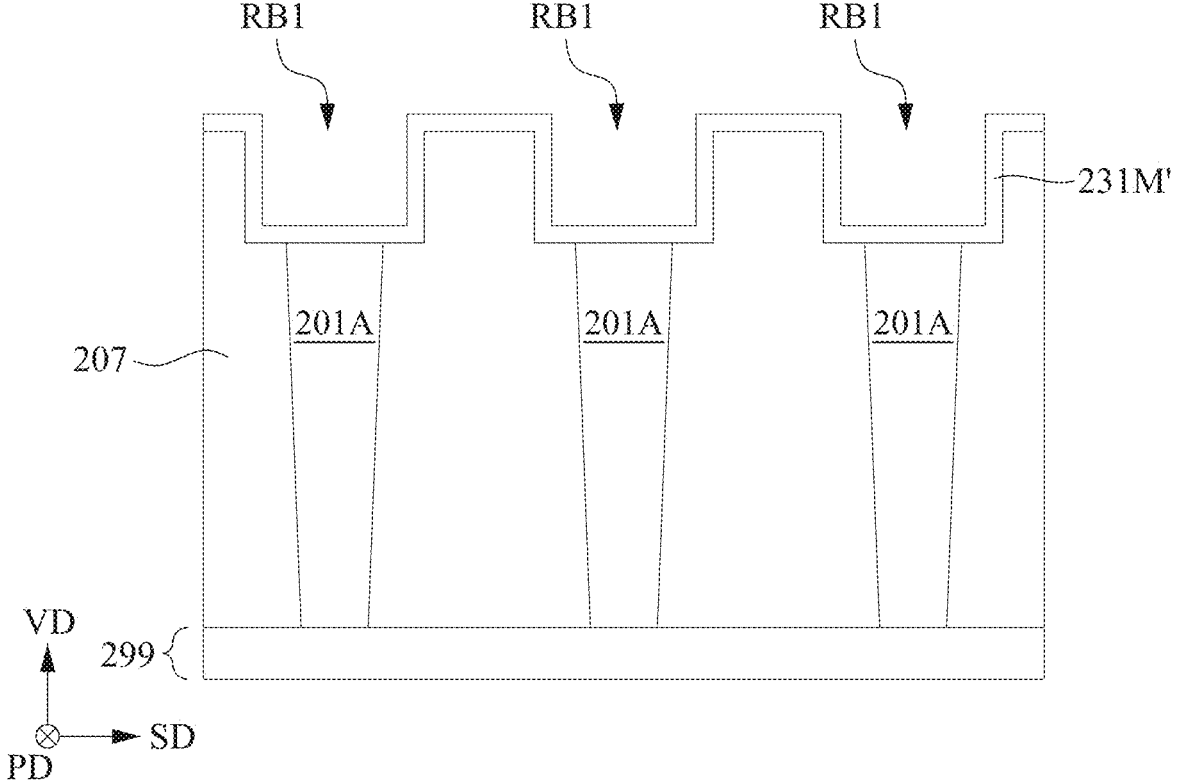
Figure 11E:
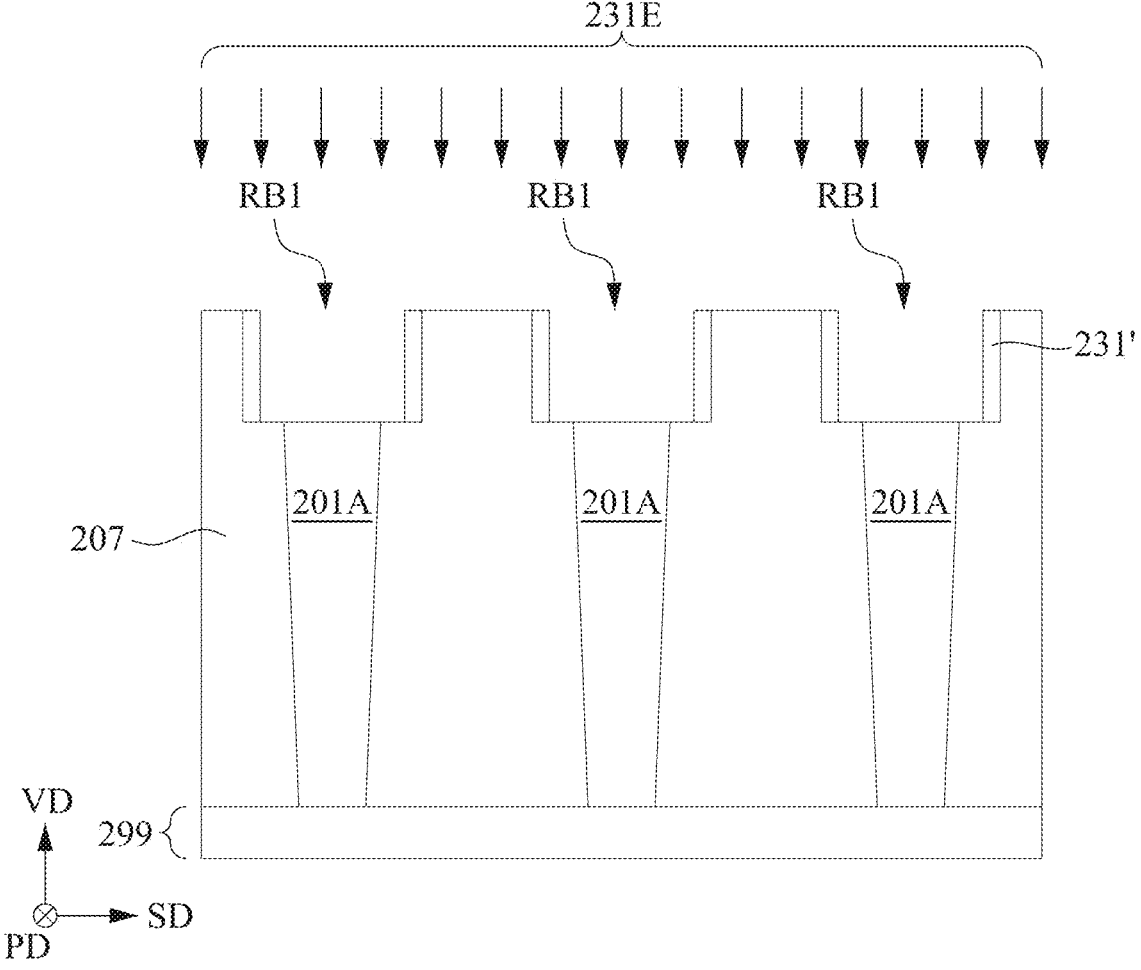
Figure 11F:
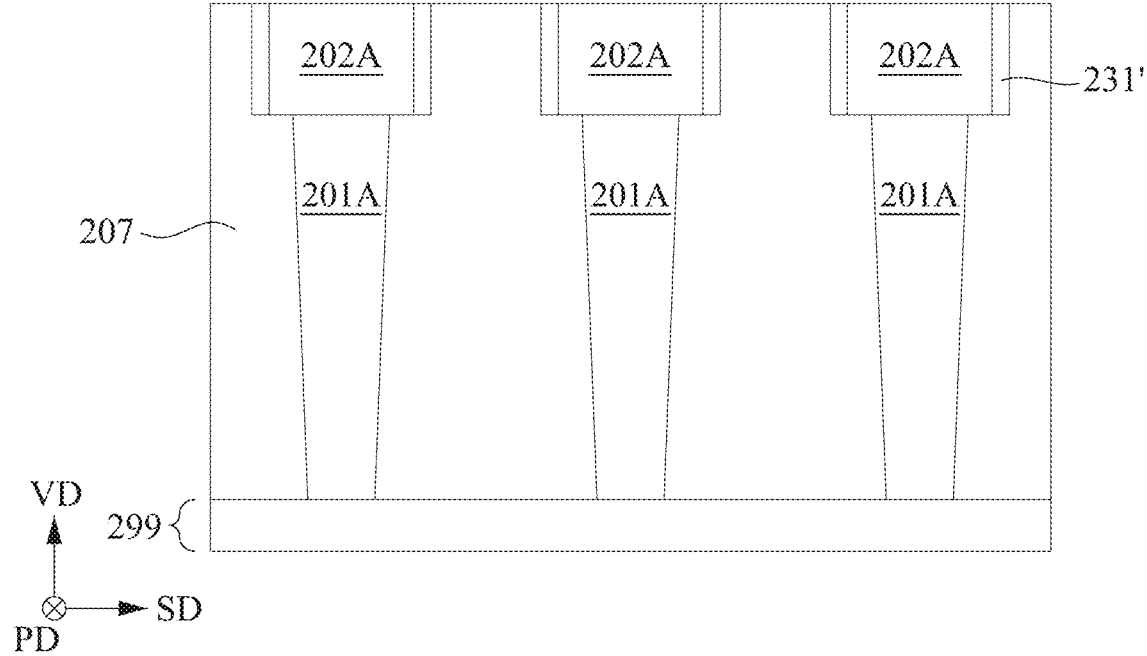
Figure 11G:
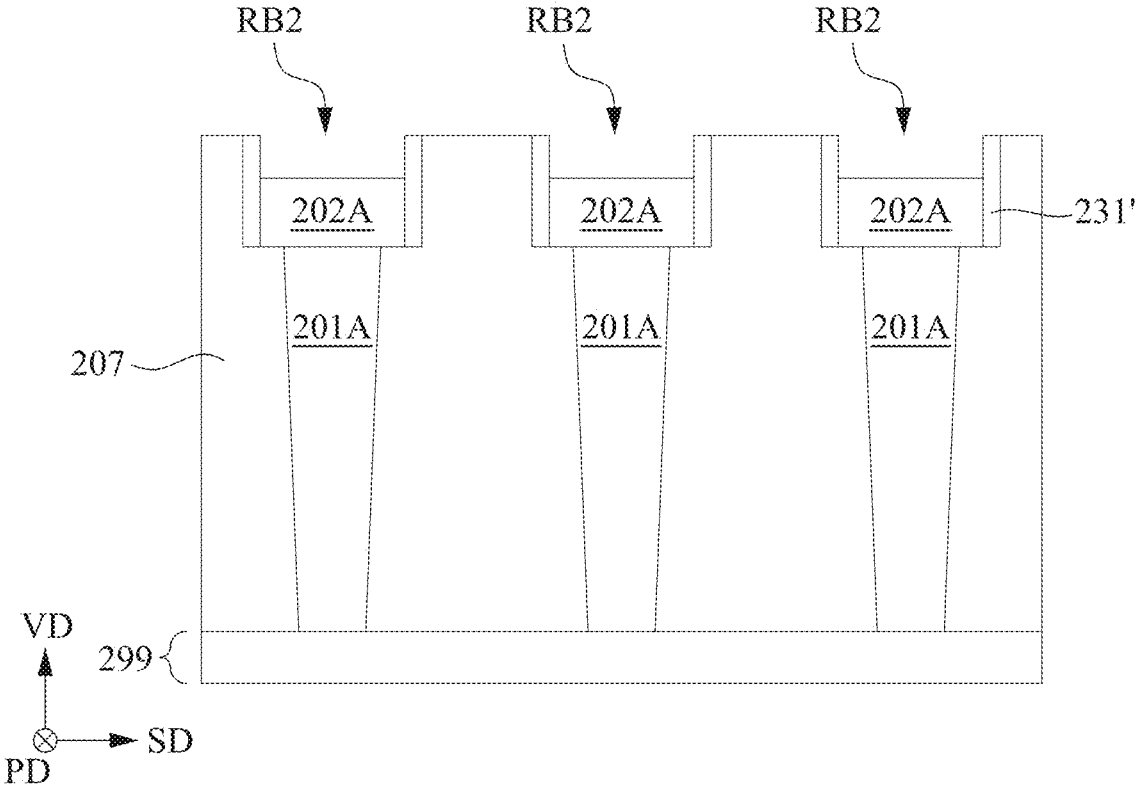
Figure 11H:
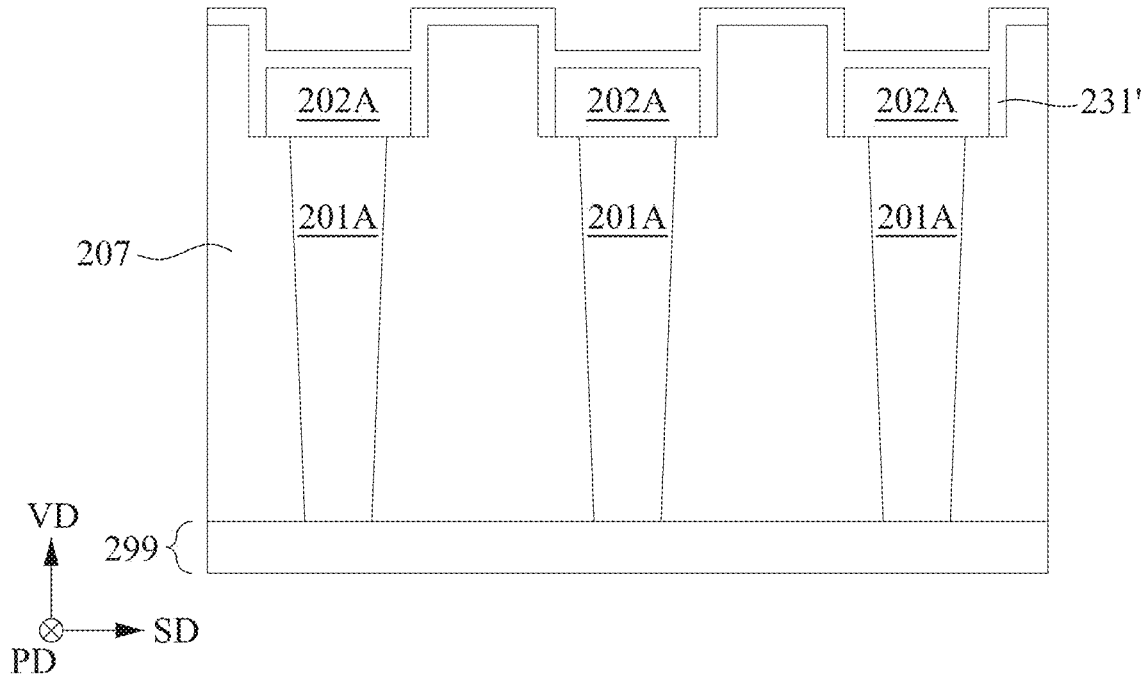
Figure 11I:
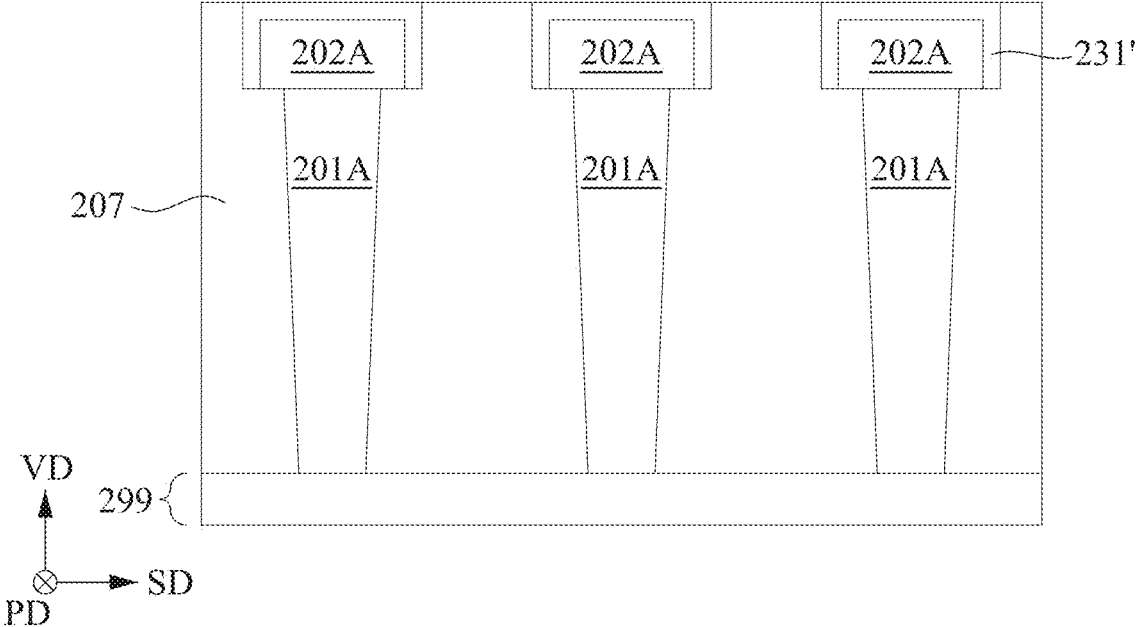
Figure 11J:
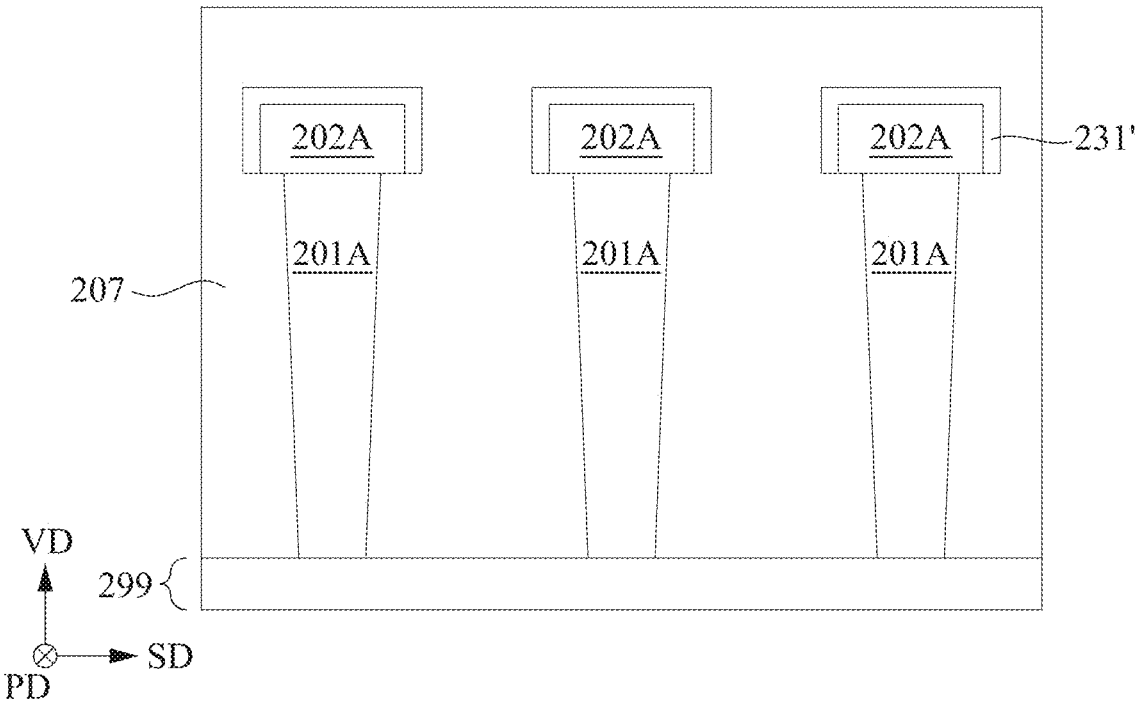
Figure 11K:
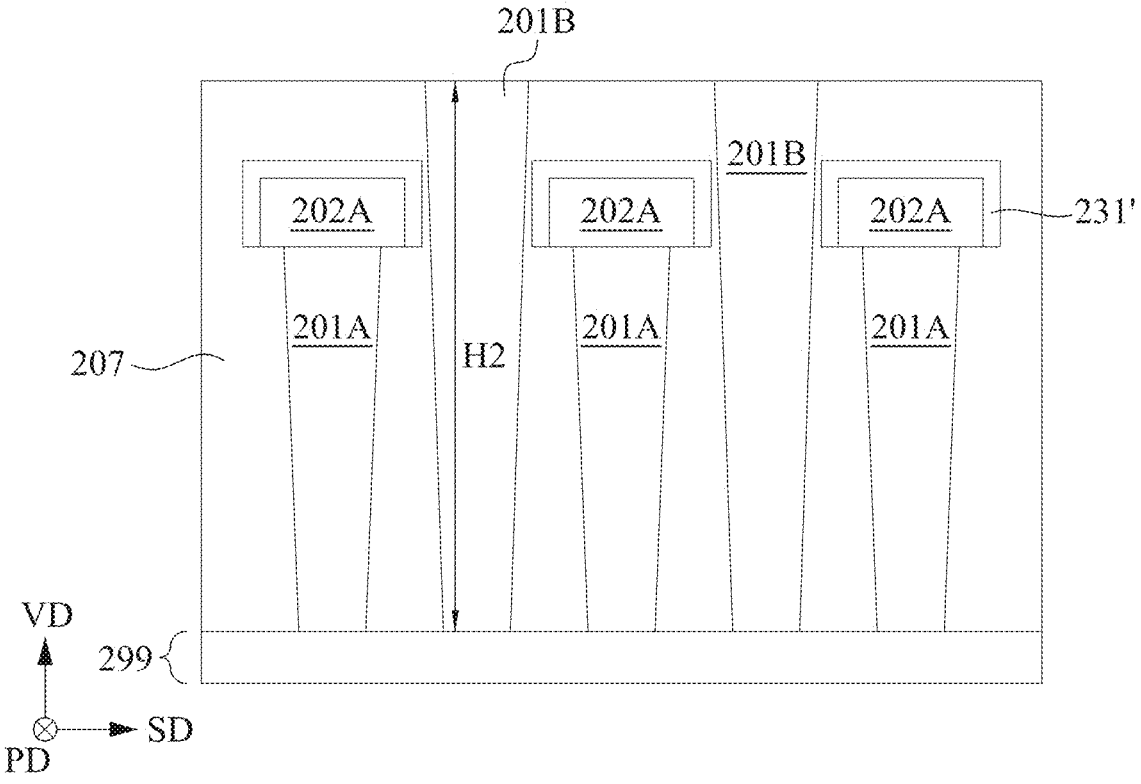
Figure 11L:
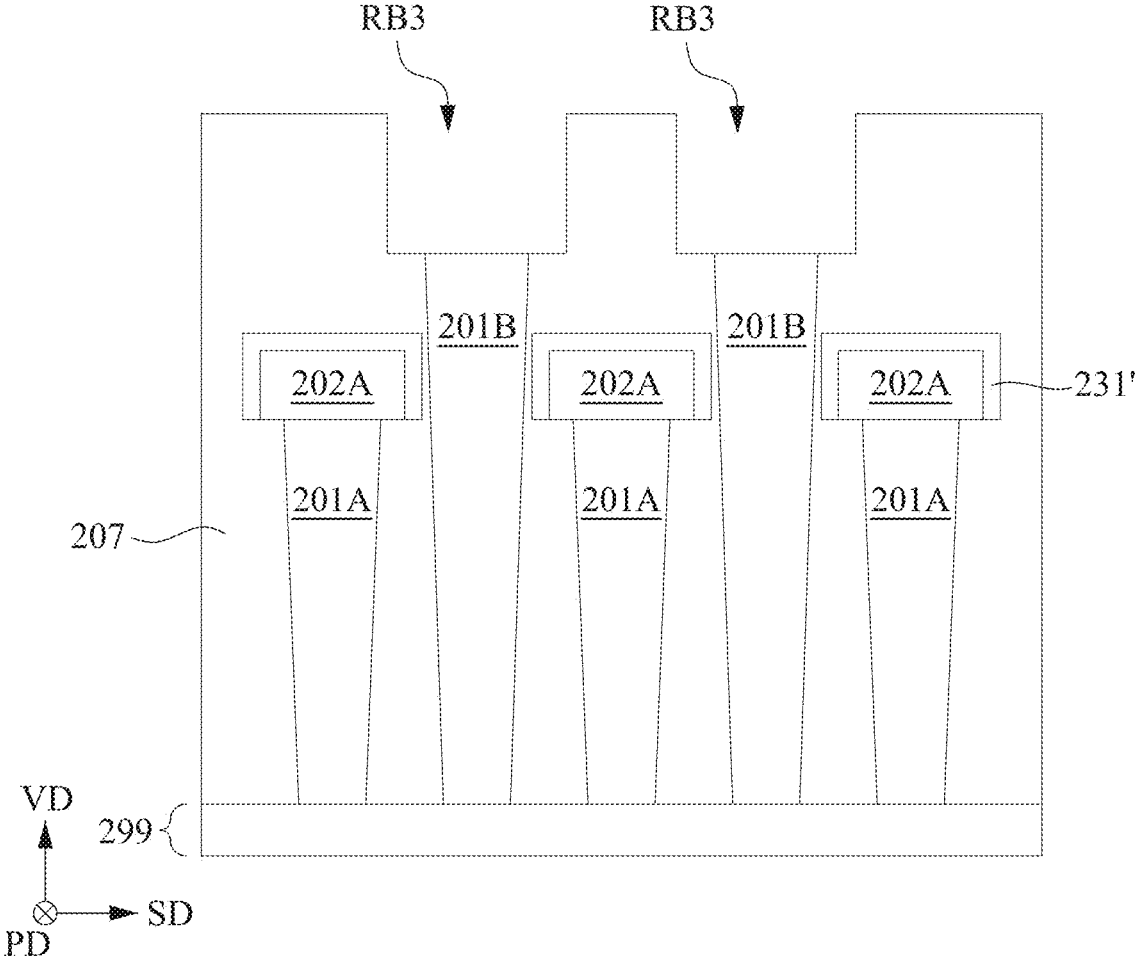
Figure 11M:
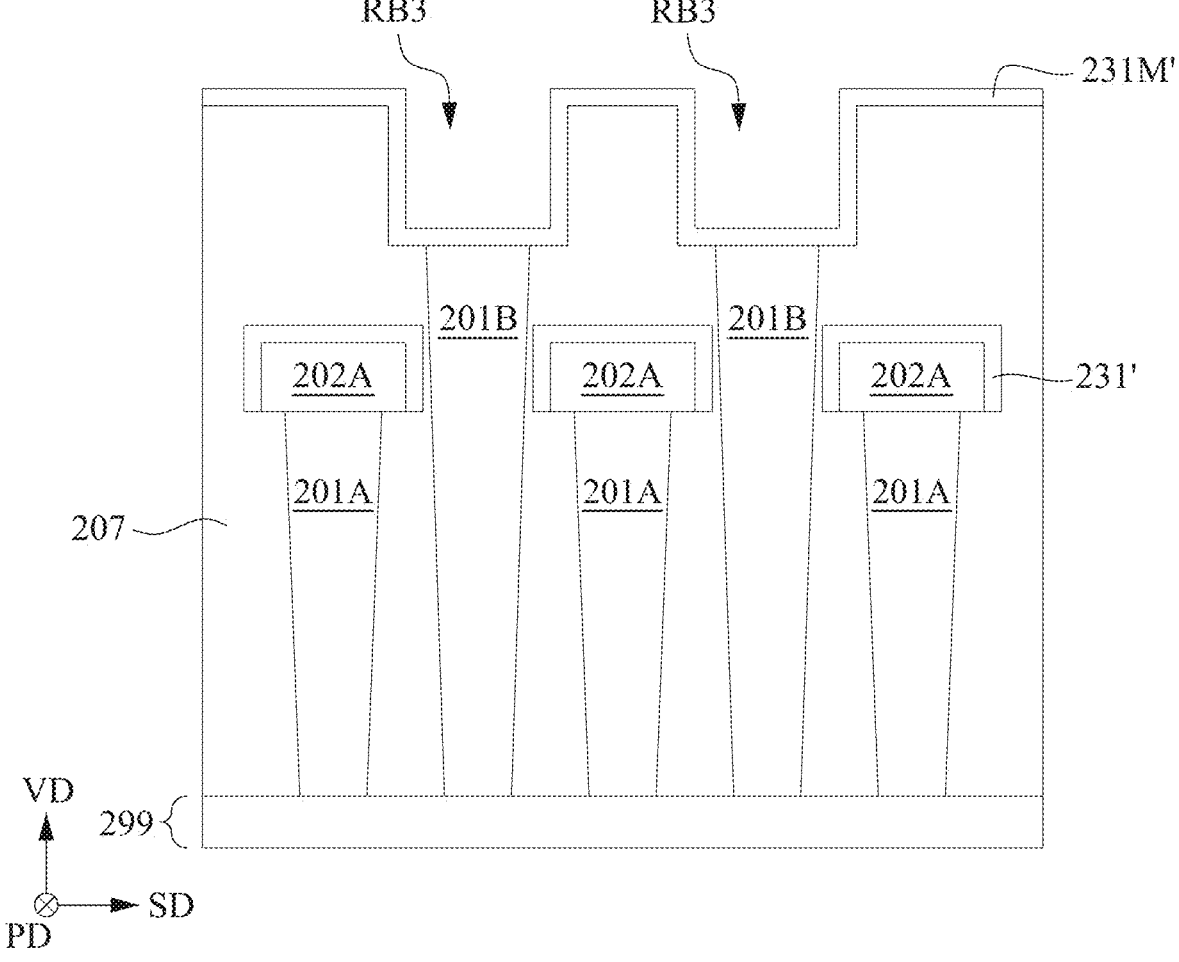
Figure 11N:
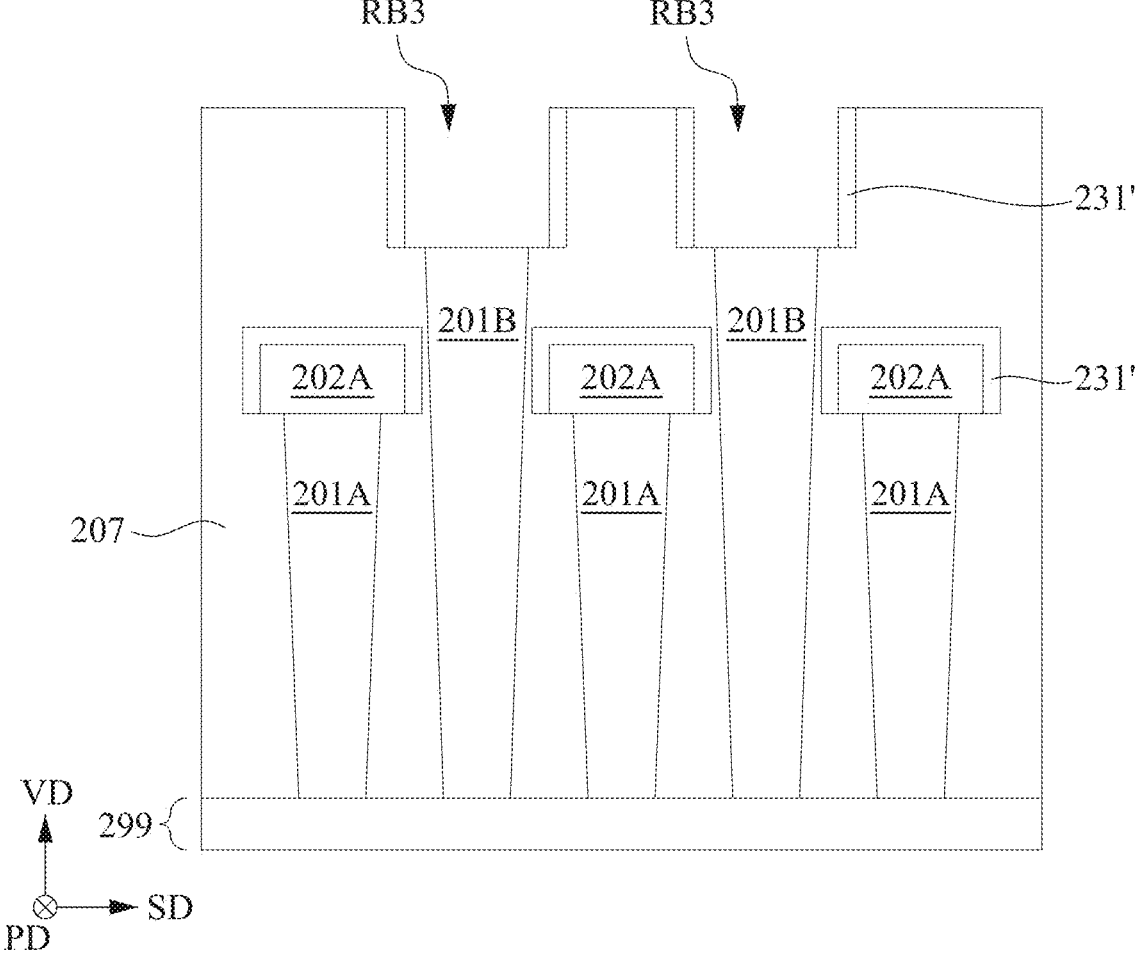
Figure 11O:
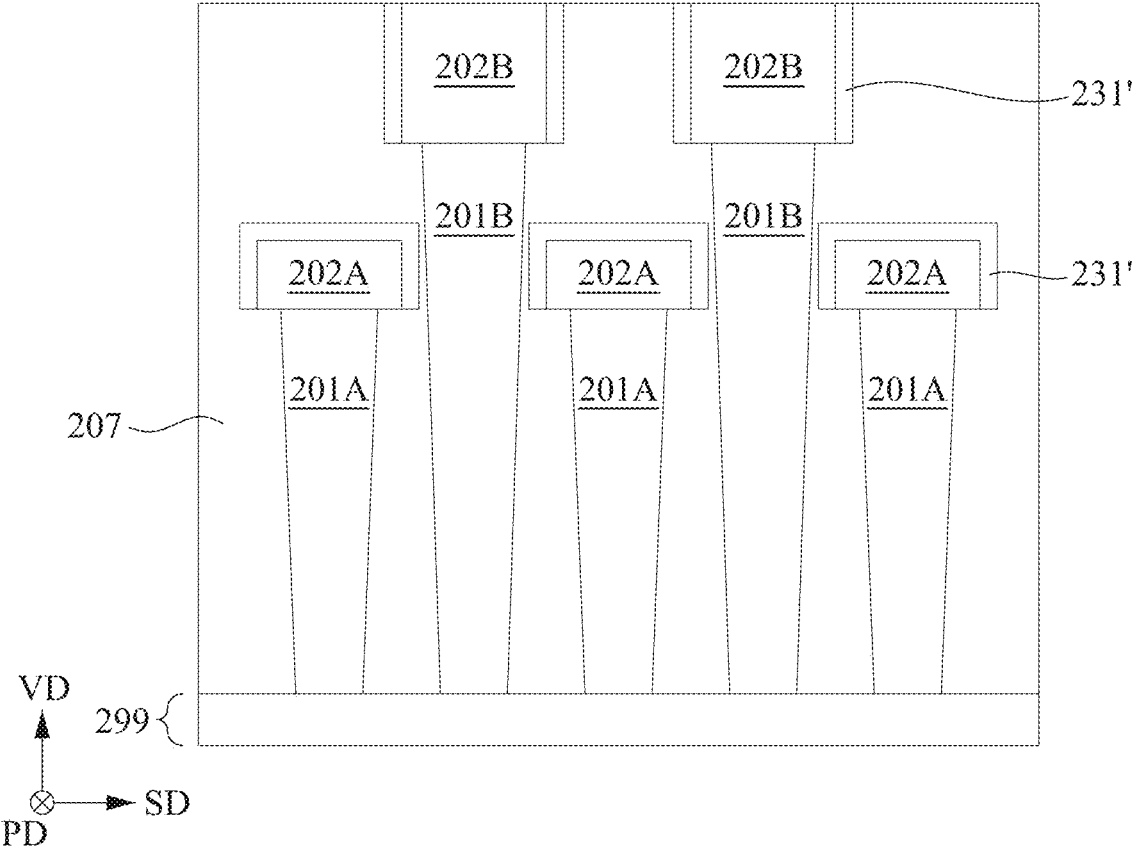
Figure 11P:
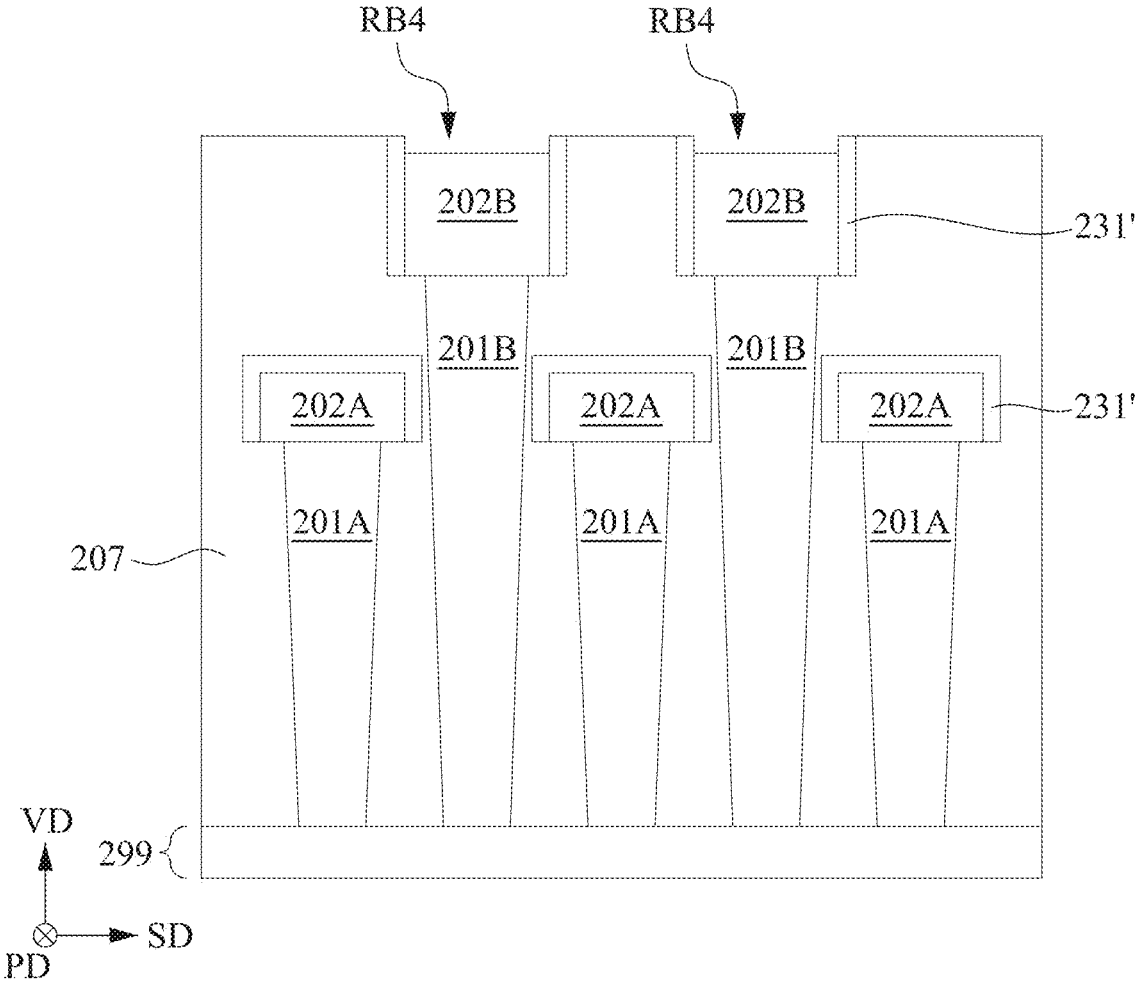
Figure 11Q:
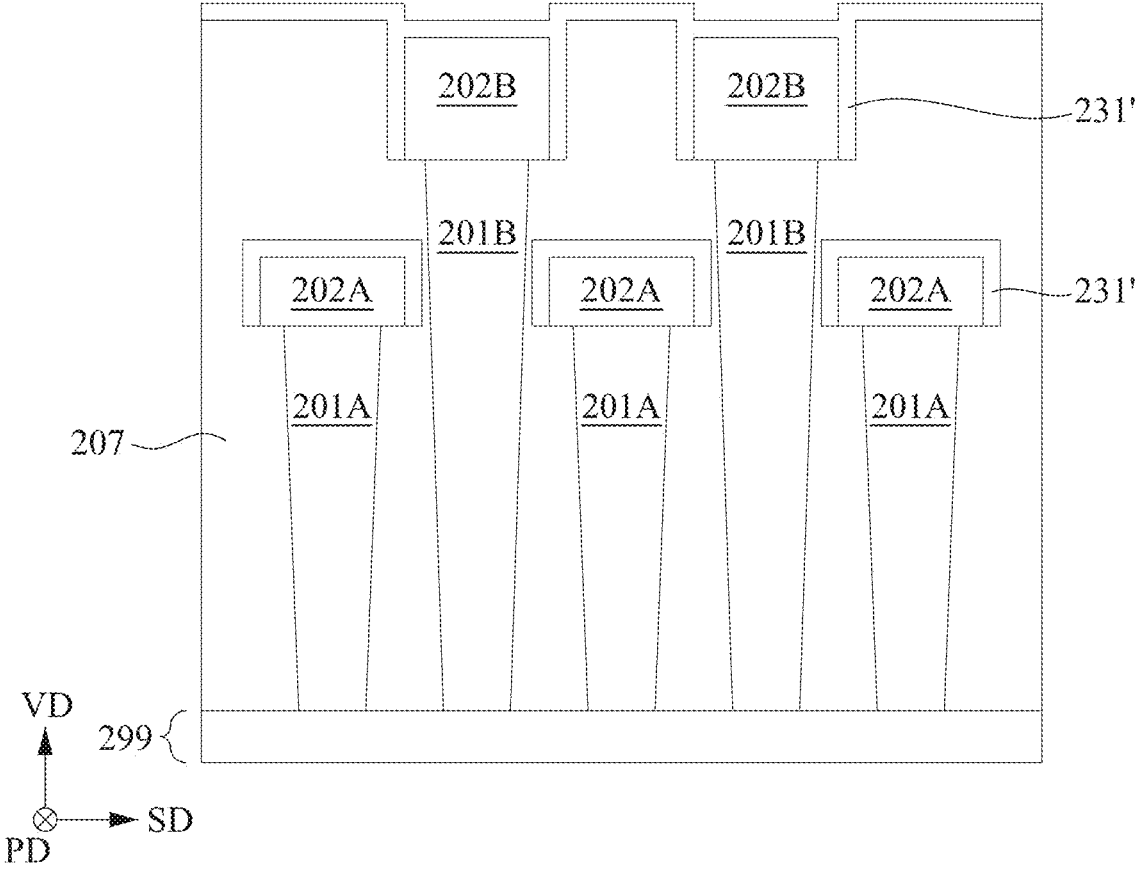
Figure 11R:
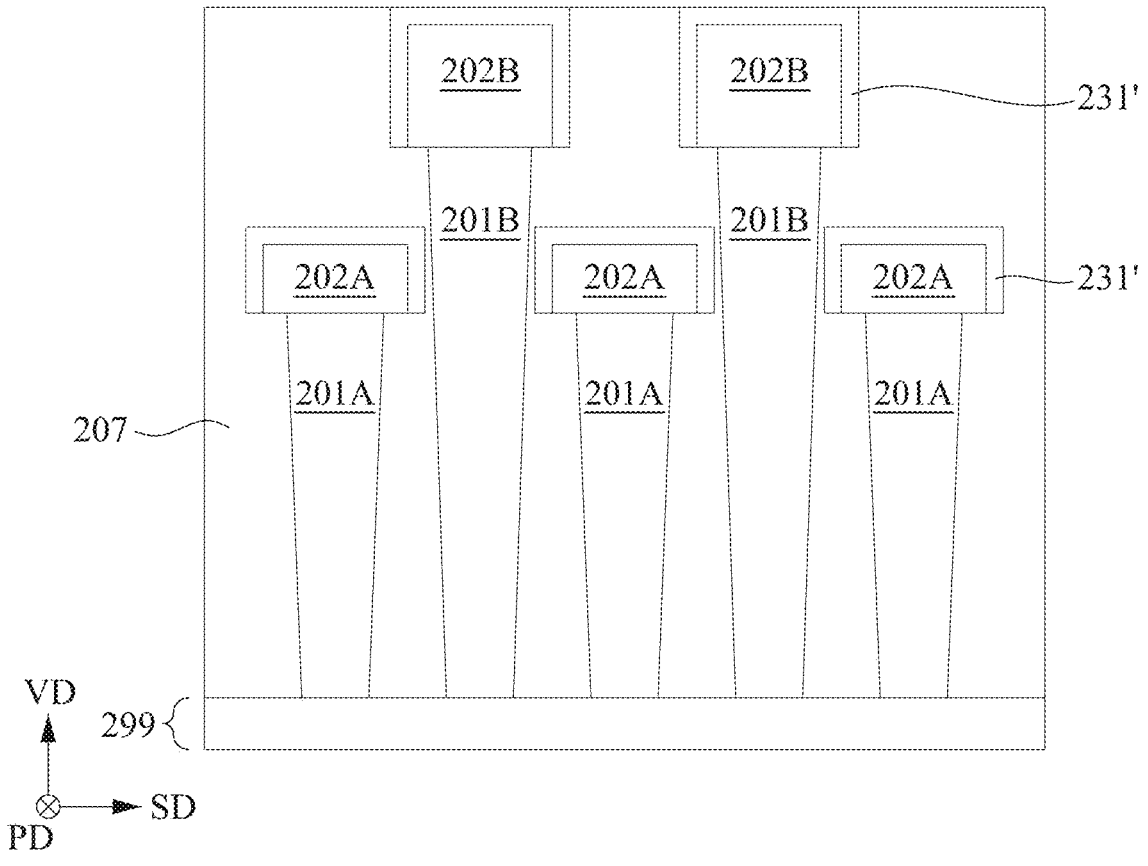
Figure 11S:
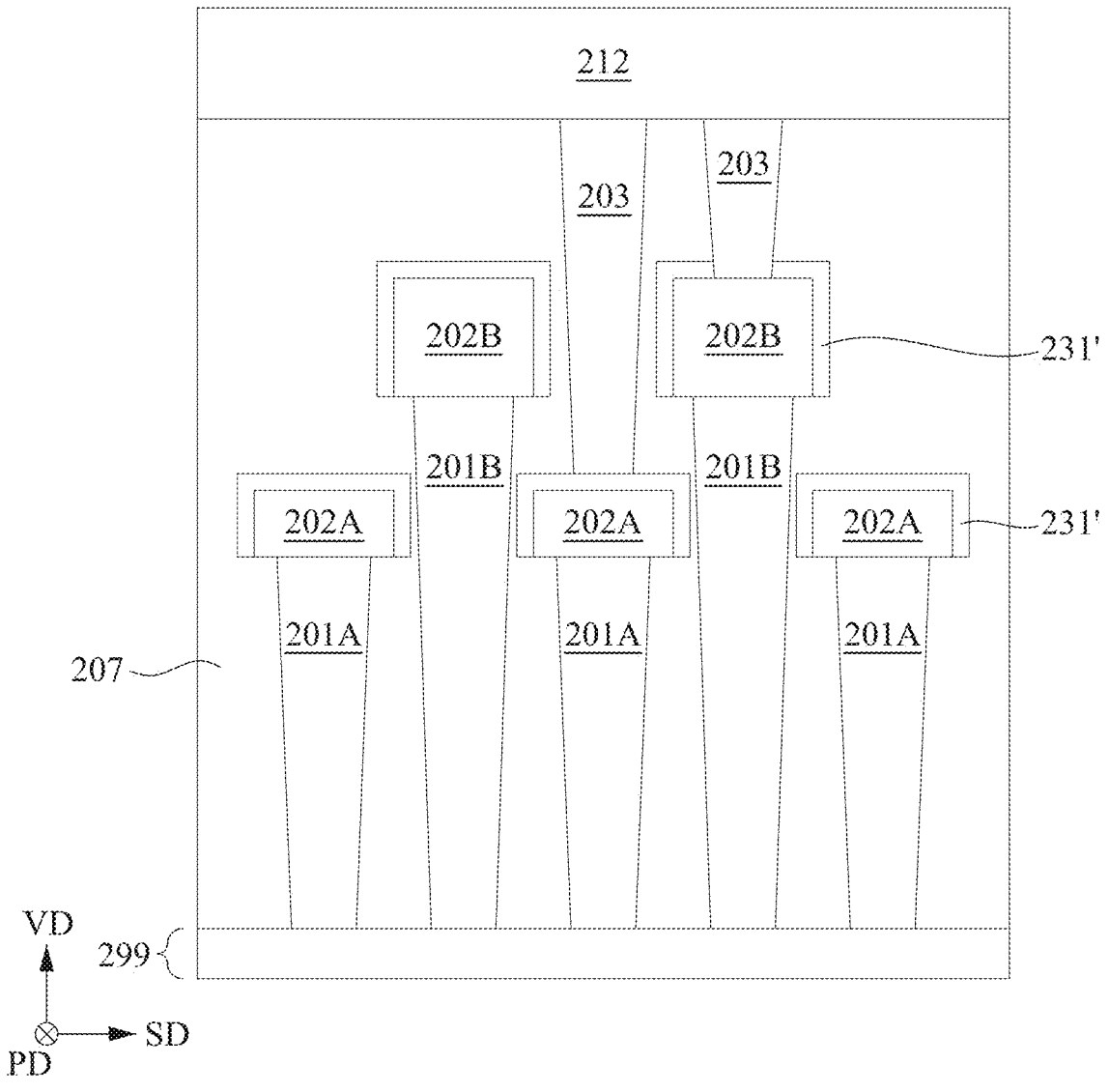
Figure 12A:
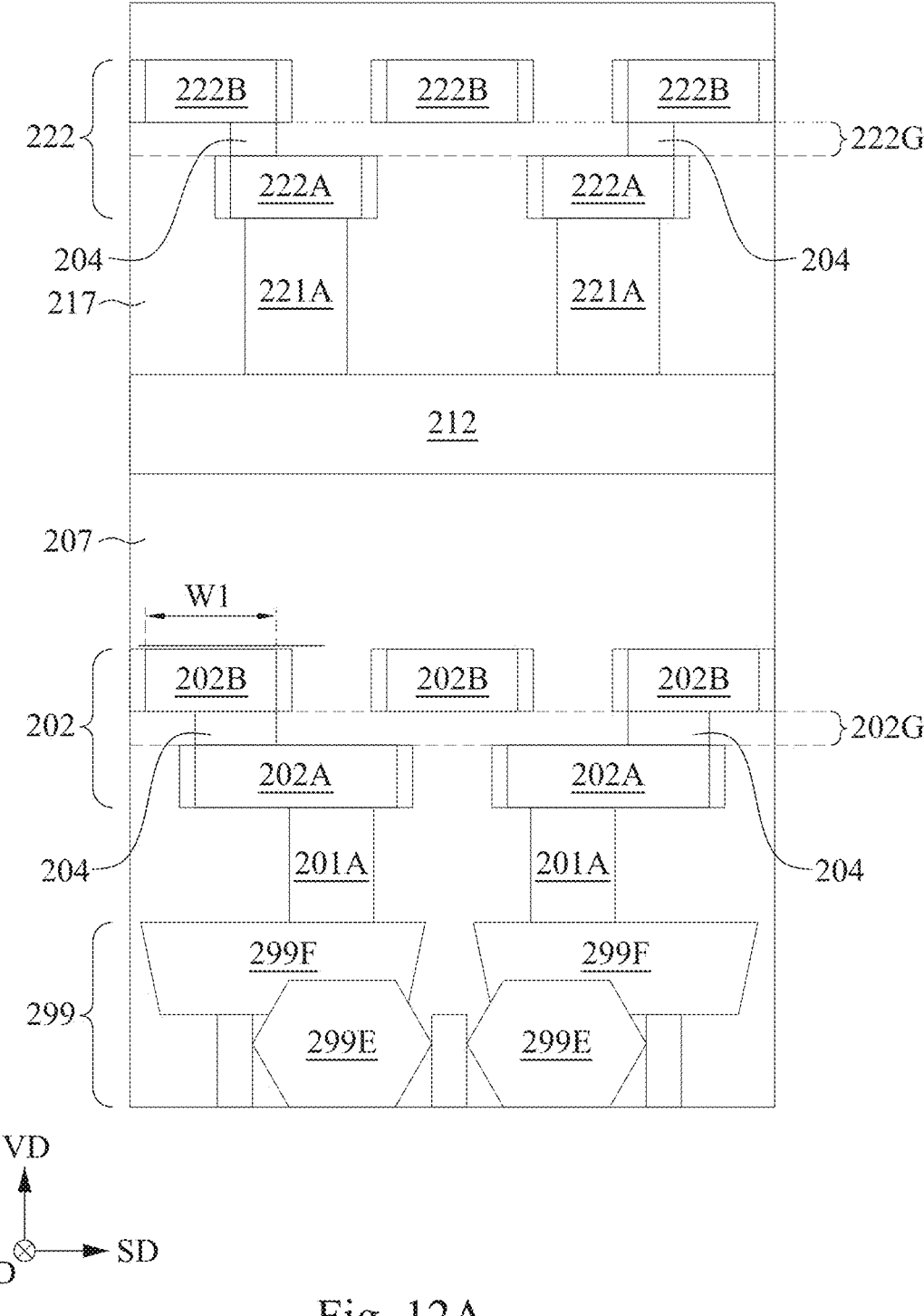
FIG. 12A is a cross sectional view of a semiconductor structure, in accordance with some embodiments of the present disclosure.
Figure 12B:
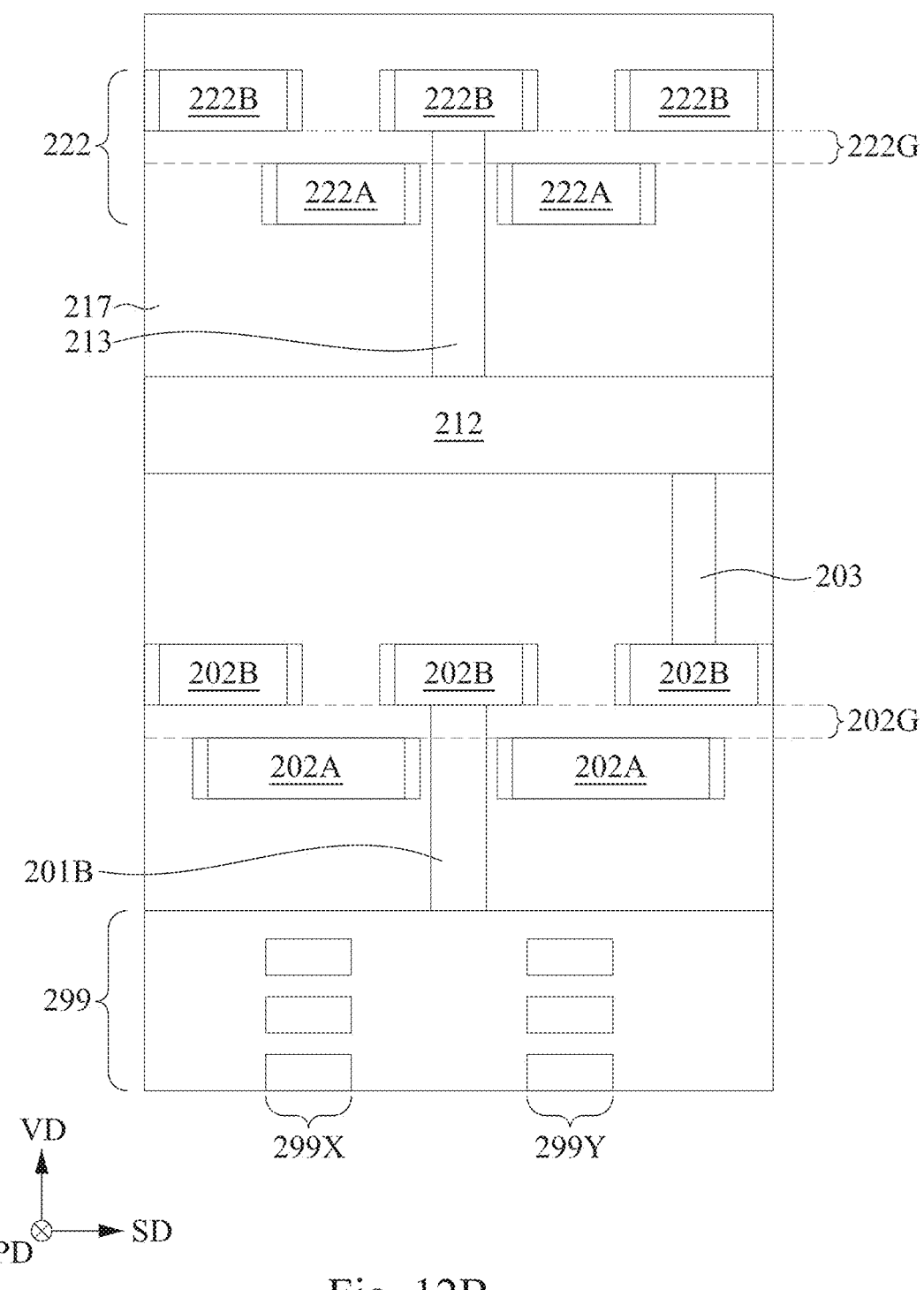
FIG. 12B is a cross sectional view of a semiconductor structure, in accordance with some embodiments of the present disclosure.

Hereinafter the techniques utilized in embodiments discussed in FIG. 4A to FIG. 7G, embodiments discussed in FIG. 8A to FIG. 11S, and embodiments discussed in FIG. 12A to FIG. 12B are applicable to embodiments of FIG. 3.

Figure 4A:
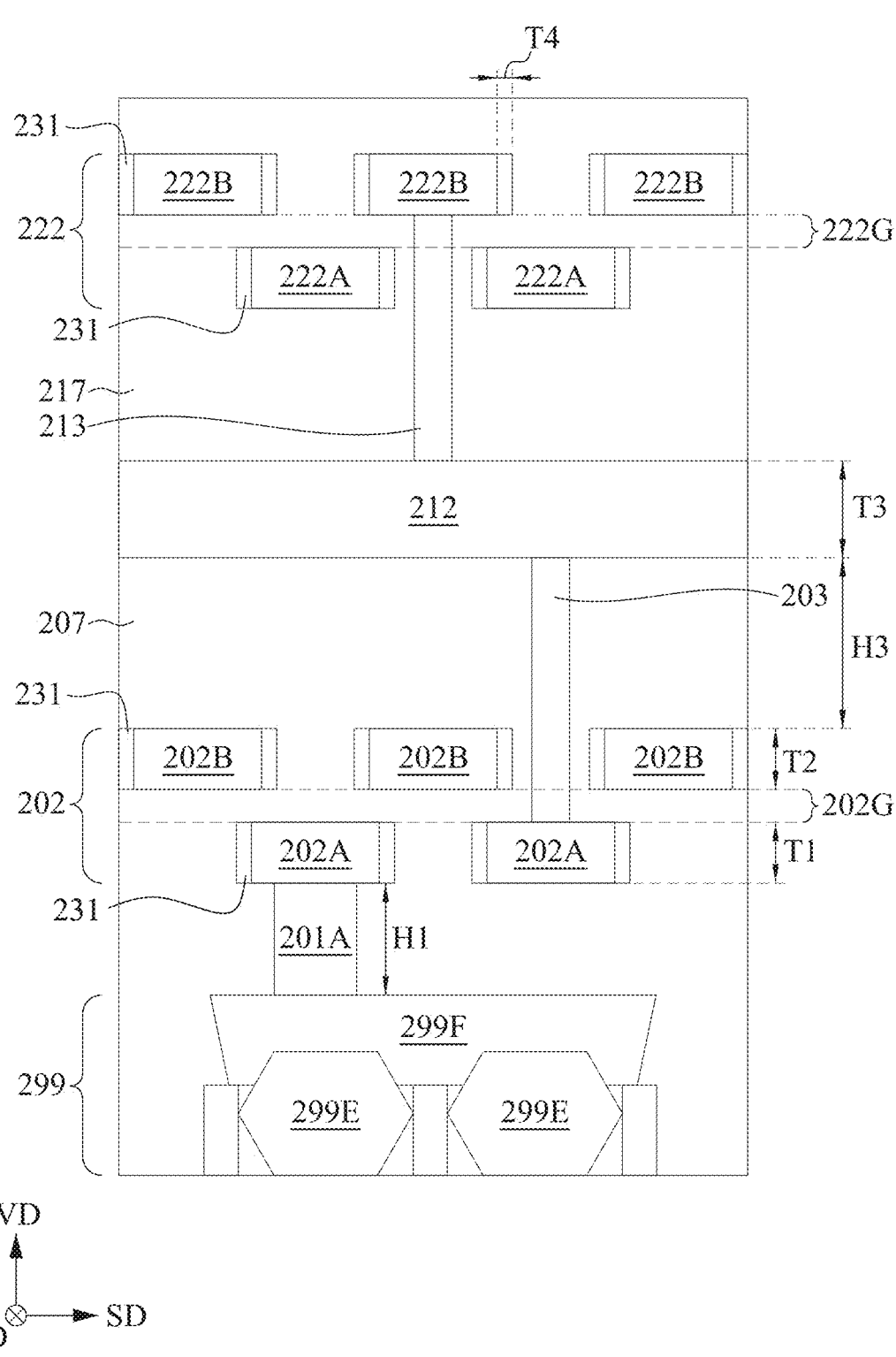
FIG. 4A is a cross sectional view of a semiconductor structure, in accordance with some embodiments of the present disclosure.
Figure 4B:
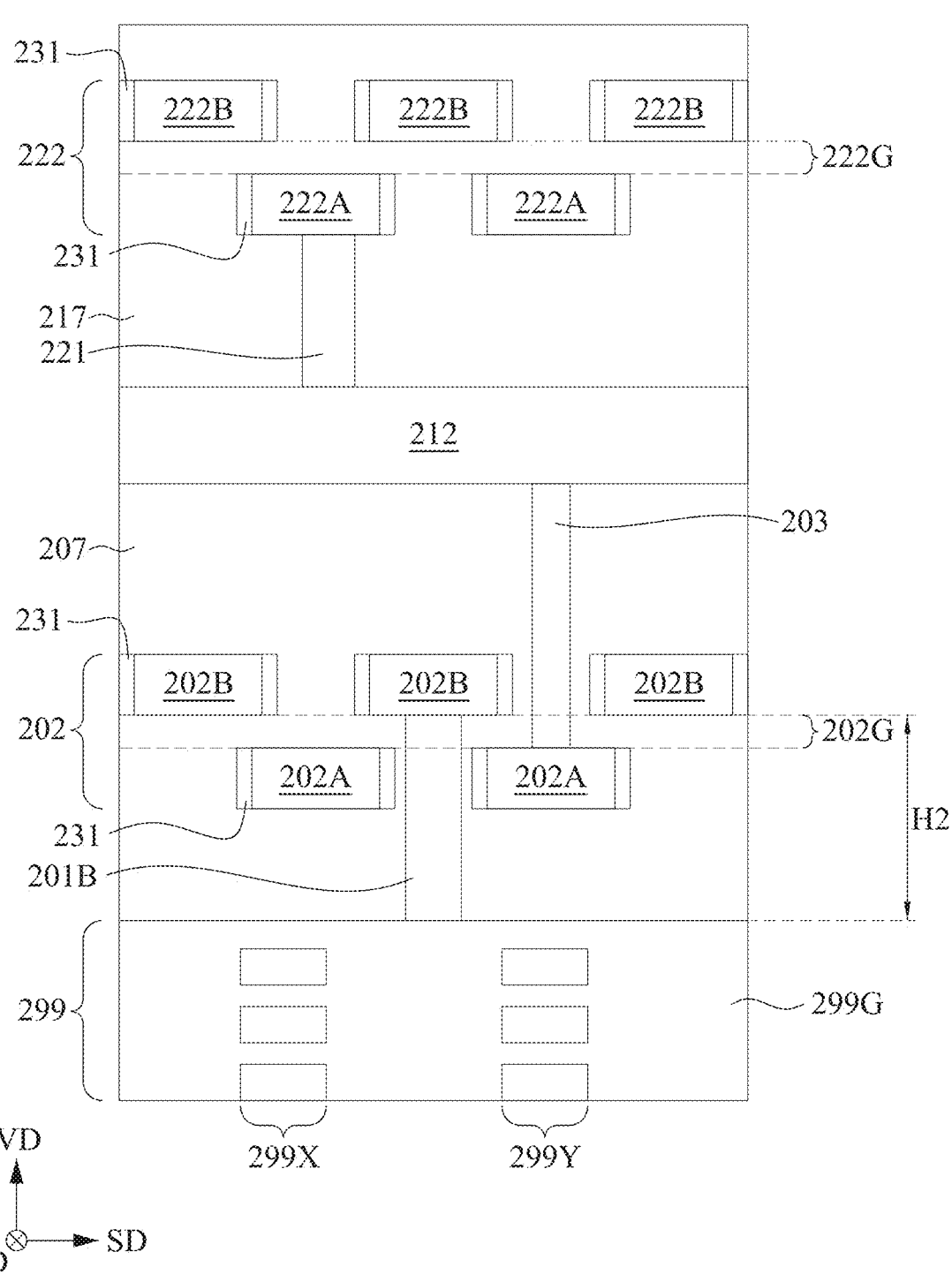
FIG. 4B is a cross sectional view of a semiconductor structure, in accordance with some embodiments of the present disclosure.

Referring to FIG. 4A and FIG. 4B, FIG. 4A is a cross sectional view of a semiconductor structure along a line A-A' in FIG. 3, and FIG. 4B is a cross sectional view of a semiconductor structure along a line B-B' in FIG. 3, in accordance with some embodiments of the present disclosure. A semiconductor structure 200 includes a substrate

299. In some embodiments, the substrate 299 includes silicon, alternatively or additionally, the substrate 299 includes another material, such as germanium, silicon carbide, gallium arsenide, gallium phosphide, indium phosphide, indium arsenide, and/or indium antimonide, or, an alloy semiconductor, such as silicon germanium (SiGe), GaAsP, AlInAs, AlGaAs, GaInAs, GaInP, and/or GaInAsP; or combinations thereof. In some other embodiments, substrate 299 includes one or more group III-V materials, one or more group II-IV materials, or combinations thereof. In some other embodiments, substrate 299 is a semiconductor-on-insulator substrate, such as a silicon-on-insulator (SOI) substrate, a silicon germanium-on-insulator (SGOI) substrate, or a germanium-on-insulator (GOI) substrate. In some other embodiments, substrate 299 may include active regions.

In some embodiments, the substrate 299 includes various conductive regions 299E configured according to design specifications, such as source regions or drain regions, which include epitaxial material doped with dopants (such as p-type or n-type dopant), in some embodiments. In some embodiments, the substrate 299 further includes transistors 299X and 299Y. In some of the embodiments, the transistors 299X and 299Y include fins, Gate-All-Around (GAA) structures, nanosheet structures, or other semiconductor structures, however, the present disclosure is not limited thereto. The substrate 299 further includes gate 299G (for example, metal gate, which is formed by replacement gate operation) around the transistors 299X and 299Y. In some embodiments, the substrate 299 further includes a conductive pattern 299F over the conductive regions 299E. In some embodiments, the conductive pattern 299F is referred to as "MD patterns" or "MOOD patterns", i.e., metal-zero-over-oxide pattern, which are configured to define electrical connection from the active devices (which may include the source/drain region). In some embodiments, the transistor 299X and transistor 299Y are doped with different dopant, such as n-type dopant and p-type dopant respectively.

A first insulation layer 207 is over the substrate 299. A first group of metal lines 202 extending along the primary direction is disposed in the first insulation layer 207 and apart from the substrate 299. The first group of metal lines 202 includes multi-level metal lines, i.e., multiple metal lines disposed at two or more leveled at different height. For example, the first group of metal lines 202 includes one or more first metal lines 202A disposed at a first level and one or more second metal lines 202B disposed at a second level above the first level. The first metal lines 202A and the second metal lines 202B are separated by a first portion of the insulation layer 207. In some embodiments, each of a top surface of the first metal lines 202A are free from physically connected to a bottom surface of each of the second metal lines 202B through a conductive path. A bottom of the second metal lines 202B is apart from a top surface of the first metal line 202A in vertical direction VD by a distance 202G (where the gap is filled with the first portion of the insulation layer 207), wherein the distance 202G is in a range from about 6 nm to 15 nm. In some embodiments, the distance 202G being less than 6 nm causes dielectric breakdown. In some embodiments, the distance 202G being more than 15 nm is against some design rules that is for the purpose of scaling down device size, or in some cases, increases the height of other adjacent vias and increase the difficulty of via fabrication. A thickness T1 of the first metal lines 202A is in a range from about 15 nm to about 25 nm, and a thickness T2 of the second metal lines 202B is in a range from about 15 nm to about 25 nm. The thickness T1 or T2 being less than 15 nm may cause reliability issue. For example, dielectric breakdown or electron migration may occur. The thickness T1 or T2 being greater than 25 nm is against some design rules that is for the purpose of scaling down device size, causes parasitic capacitance issues, or in some cases, increases the height of other adjacent vias. In some embodiments, a material of the first metal lines 202A and the second metal lines 202B includes ruthenium (Ru), aluminum (Al), copper (Cu), tungsten (W), or other suitable materials with high conductivity.

In some embodiments, the first metal lines 202A and the second metal lines 202B are in a staggered configuration, that is, at least a portion of the first metal lines 202A is free from overlapping with the second metal lines 202B in the vertical direction VD, and at least a portion of the second metal line 202B is free from overlapping with the first metal lines 202A in the vertical direction VD; while a portion of the first metal lines 202A overlaps with the second metal line 202B in the vertical direction VD so that the cell height W (shown in FIG. 3) is reduced. A first conductive via 201A is electrically connected between the conductive pattern 299F and a bottom surface of the first metal line 202A, and a second conductive via 201B is electrically connected between the gate 299G and the bottom surface of the second metal line 202B. The bottom surface of the second conductive via 201B and the bottom surface of the first conductive via 201A may be connected to a top surface of the substrate 299. A height H1 of the first conductive via 201A is in a range from about 8 nm to about 20 nm, and a height H2 of the second conductive via 201B is greater than height H1, for example, in a range from about 30 nm to about 40 nm. Forming the second conductive via 202A having height H2 being greater than 40 nm is difficult, or in some instances, has greater bulk resistance, requires high difficulty high aspect ratio etching operation, or faces void issues in deposition operation. The height H1 of the first conductive via 201A being greater than 20 nm or the height H2 being less than 30 nm faces the issue of dielectric breakdown since the separation between the first conductive via 201A and the second conductive via 201B is too small. In some instances, the height H1 being greater than 20 nm faces the issue of increased bulk resistance. For example, voids may occur during deposition operations, etching operation becomes more difficult due to higher aspect ratio, and/or overall bulk resistance becomes greater. The height H1 of the first conductive via 201A being less than 8 nm faces dielectric breakdown issue or reliability issues. For example, coupling effect may occur between the first metal lines 202A and underlying gate structures, which affect the electrical signal. One of ordinary skill in the art would understand that, although in the example shown in FIG. 4A to FIG. 4B, the first conductive via 201A and the second conductive via 201B are at different cross sections, the present disclosure is not limited thereto. In some alternative embodiments, the first conductive via 201A and the second conductive via 201B are partially or fully aligned and thereby shown on one cross section. In some embodiments, a lateral distance between the first conductive via 201A and the second conductive via 201B is in a range from about 6 nm to about 10 nm. When the lateral distance is less than 6 nm, the issue of dielectric breakdown occurs, in some instances. The lateral distance being greater than 10 nm is against some design rules that is for the purpose of scaling down device size.

A third metal line 212 extending along the secondary direction SD is above and orthogonal to the first metal lines 202A and the second metal lines 202B. A third conductive via 203 is electrically connected between the third metal line 212 and a top surface of the first metal line 202A (or in some alternative embodiments, a top surface of the second metal line 202B). In some embodiments, a portion of the first insulation layer 207 intersecting between the first metal line 202A and the second metal line 202B is penetrated by the second conductive via 201B and the third conductive via 203. A thickness T3 of the third metal line 212 is in a range from about 20 nm to about 30 nm. The thickness T3 being less than 20 nm faces reliability issue, the thickness T3 being greater than 30 nm is against some design rules that is for the purpose of scaling down device size. A distance H3 between the top surface of the second metal line 202B and a bottom surface of the third metal line 212 is in a range from about 10 nm to about 30 nm. In the instance of the height H3 being greater than 30 nm, forming third conductive via 203 is difficult, or in some instances, the third conductive via 203 has greater bulk resistance or faces void issues in deposition operation. The height H3 being less than 10 nm faces reliability issue, such as dielectric breakdown.

A second insulation layer 217 is over the third metal line 212. A second group of metal lines 222 extending along the primary direction is disposed in the second insulation layer 217 and apart from the third metal line 212. In some embodiments, the second group of metal lines 222 also includes the multi-level metal lines configuration similar to the first metal lines 202A and the second metal lines 202B, for example, fourth metal lines 222A at third level and fifth metal lines 222B at fourth level above the third level. A third conductive via 213 is connected between the third metal line 212 and the fifth metal lines 222B, a fourth conductive via 221 is connected between the fourth metal lines 222A and the third metal line 212. In some alternative embodiments, the second group of metal lines 222 includes a plurality of metal lines at one level.

In some embodiments, a protection layer 231 is disposed to be lining at the sidewall of the first metal lines 202A, the second metal lines 202B, the fourth metal lines 222A, and/or the fifth metal lines 222B. The protection layer 231 includes insulation materials, such as Hi-k material, silicon nitride, nitride-based material, or types of metallic oxide that has high resistivity. The protection layer 231 serves as a barrier separating the conductive part of aforementioned metal lines and adjacent conductive vias (e.g., second conductive via 201B, the third conductive via 203, and/or the third conductive via 213), thereby alleviating the issue of electrical short. In some embodiments, a thickness T4 of the protection layer 231 is in a range from about 3 nm to about 7 nm, or around one third of a thickness of the metal lines, so that the protection layer 231 may effectively alleviate the issue of electrical short. When the thickness T4 of the protection layer 231 is thicker than the aforementioned values, the protection layer 231 may undesirably decrease the space for forming adjacent conductive features and/or increase the overall resistance of the semiconductor device 200. In some embodiments, a top surface of the protection layer 231 is under a coverage of a vertical projection area of the second metal line.

Figure 5A:
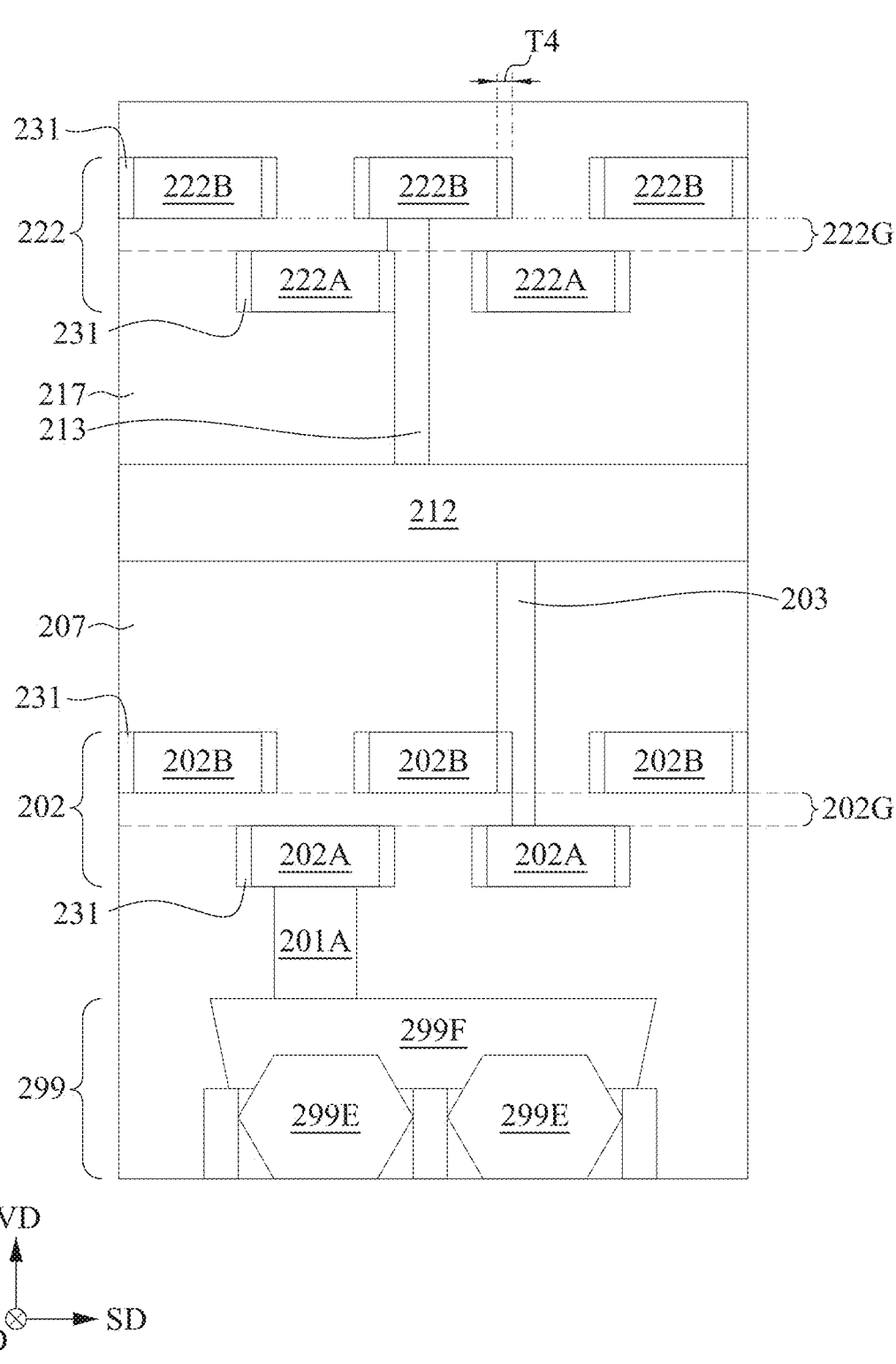
FIG. 5A is a cross sectional view of a semiconductor structure, in accordance with some embodiments of the present disclosure.
Figure 5B:
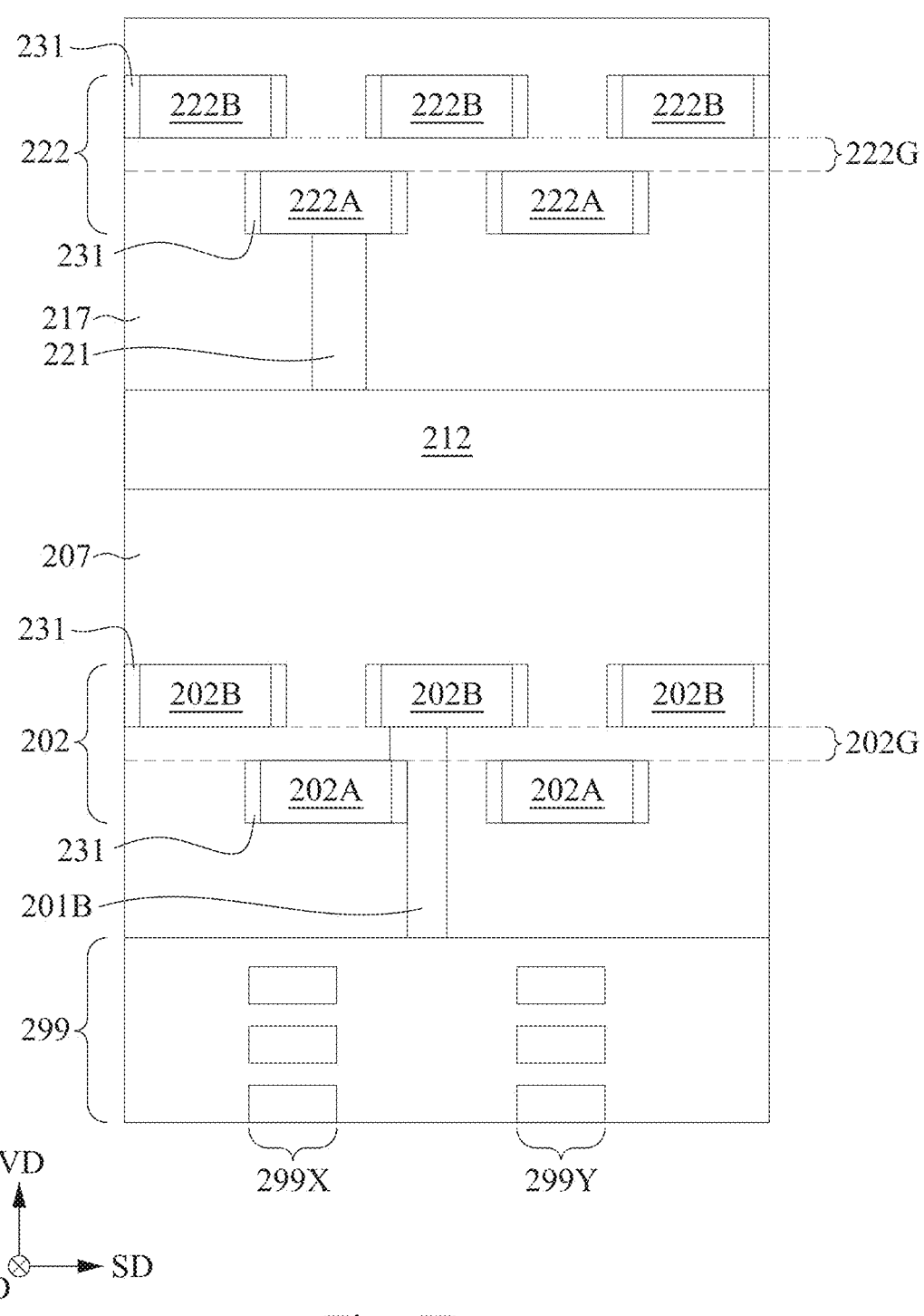
FIG. 5B is a cross sectional view of a semiconductor structure, in accordance with some embodiments of the present disclosure.

Referring to FIG. 5A and FIG. 5B, FIG. 5A is a cross sectional view of a semiconductor structure, and FIG. 5B is a cross sectional view of a semiconductor structure, in accordance with some embodiments of the present disclosure. The semiconductor structure 200' shown in FIG. 5A to FIG. 5B is similar to the semiconductor structure 200 shown in FIG. 4A to FIG. 4B. Differences reside in that the protection layer 231 being in direct physical contact with the second conductive via 201B, the third conductive via 203, and/or the third conductive via 213. Specifically, due to overlay shift issue of conductive vias, reduced landing area in advanced technology nodes, and/or other limits with regard to precision of fabrication process, the position of the conductive vias may be shifted and thereby having a landing area overlapping with the adjacent metal lines. Thereby the protection layer 231 separates the conductive vias from the conductive portion of metal lines. In some embodiments, at least a portion of a sidewall of the protection layer 231 is in direct contact with the second conductive via 201B, the third conductive via 203, and/or the third conductive via 213. In some embodiments, a portion of a top surface of the protection layer 231 is in direct contact with the second conductive via 201B, the third conductive via 203, and/or the third conductive via 213. In some embodiments, a thickness T4 of the protection layer 231 is in a range from about 3 nm to about 7 nm or around one third of a thickness of the metal lines, so that the protection layer 231 may effectively alleviate the issue of electrical short (e.g., the top surface of the first metal lines 202A is free from being in direct contact with the second conductive via 201B). When the thickness T4 of the protection layer 231 is thicker than the aforementioned values, the protection layer 231 may undesirably decrease the space for forming adjacent conductive features and/or increase the overall resistance of the semiconductor device 200'.

Referring to FIG. 6, FIG. 6 shows a flow chart of a method for fabricating a semiconductor device, in accordance with some embodiments of the present disclosure. The method 1000 for fabricating a semiconductor device includes providing a substrate (operation 1001, see, for example, FIG. 7A), forming a first insulation material over the substrate (operation 1004, see, for example, FIG. 7A), forming a first conductive via in the first insulation material (operation 1007, see, for example, FIG. 7A), forming the first insulation material over the first conductive via (operation 1013, see, for example, FIG. 7B), forming a first recess over the first conductive via in the first insulation material (operation 1018, see, for example, FIG. 7C), forming a second insulation material lining with a sidewall of the first recess (operation 1024, see, for example, FIG. 7D to FIG. 7E), forming a first metal line in the first recess (operation 1029, see, for example, FIG. 7F), forming a second conductive via having a height greater than a height of the first conductive via (operation 1034, see, for example, FIG. 7G), forming a second metal line over the top surface of the second conductive via (operation 1039, see, for example, FIG. 7I), and forming a third metal line over the second metal line (operation 1044, see, for example, FIG. 7J).

One of ordinary skill in the art would understand that although the example each of the first conductive vias 201A and the second conductive vias 201B (et cetera) are presented in one cross section view in FIG. 7A to FIG. 7J, the scope of the present disclosure also includes the embodiments of one or more of aforementioned elements disposed on different positions, which are shown in different cross sections.

Figure 7A:
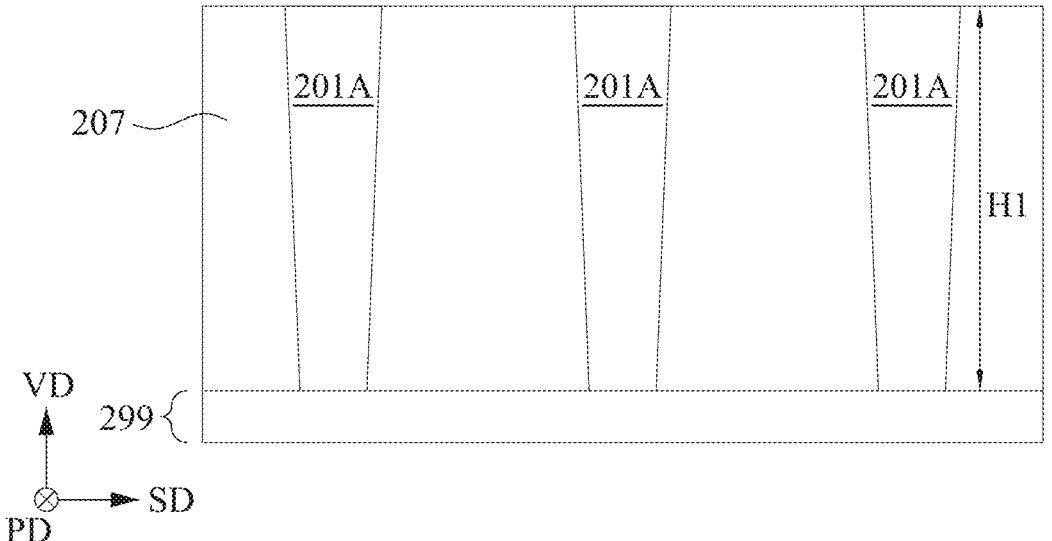
FIG. 7A to FIG. 7J are cross sectional views of a semiconductor structure during intermediate stages of manufacturing operations, according to some embodiments of the present disclosure.

Referring to FIG. 7A, FIG. 7A is a cross sectional view of a semiconductor structure during intermediate stages of manufacturing operations, according to some embodiments of the present disclosure. A substrate 299 is provided, wherein the material and the configuration of the substrate 299 are similar to the previous discussion in FIG. 4A to FIG. 4B. A first insulation layer 207 is formed over the substrate 299. One or more first conductive vias 201A are formed over the substrate 299 and in the first insulation layer 207. In some embodiments, a planarization operation, such as chemical mechanical planarization (CMP) operation, is performed from the top surface of the first insulation layer 207 to remove excessive material of the first conductive vias 201A. After the planarization operation, a height H1 of the first conductive vias 201A is in a range from about 30 nm to about 40 nm. As previously discussed in FIG. 4A to FIG. 4B, in some instances, the height H1 being greater than 20 nm faces the issue of increased bulk resistance. The height H1 of the first conductive via 201A being less than 8 nm faces dielectric reliability issues such as breakdown issue.

Figure 7B:
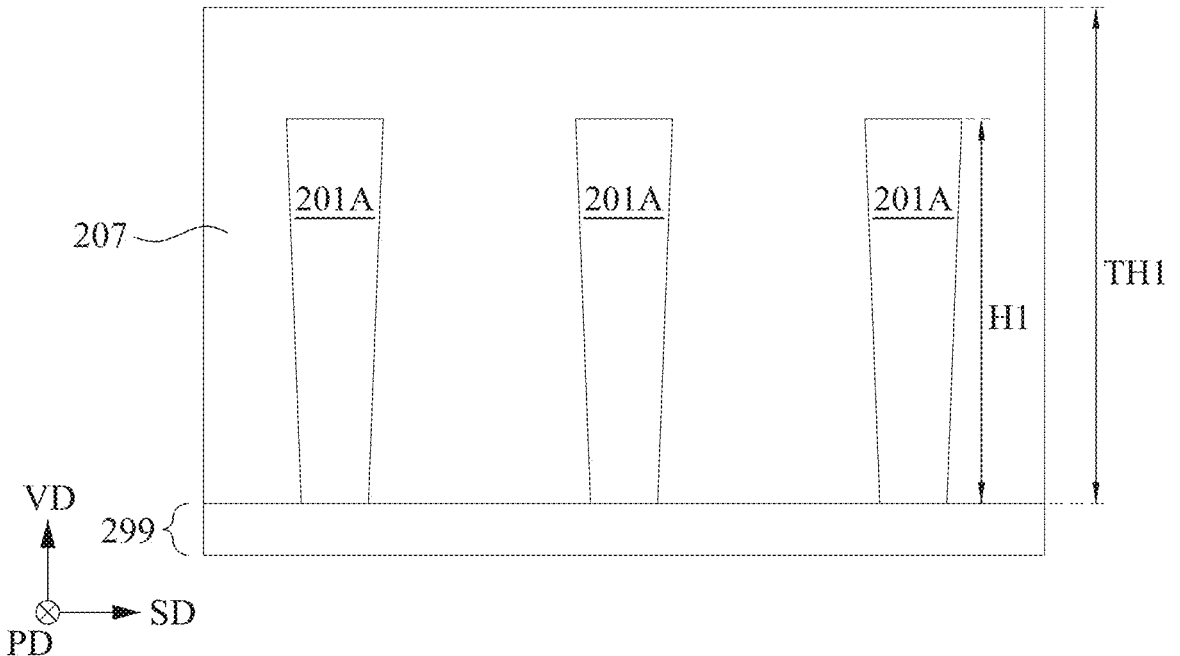
Figure 7C:
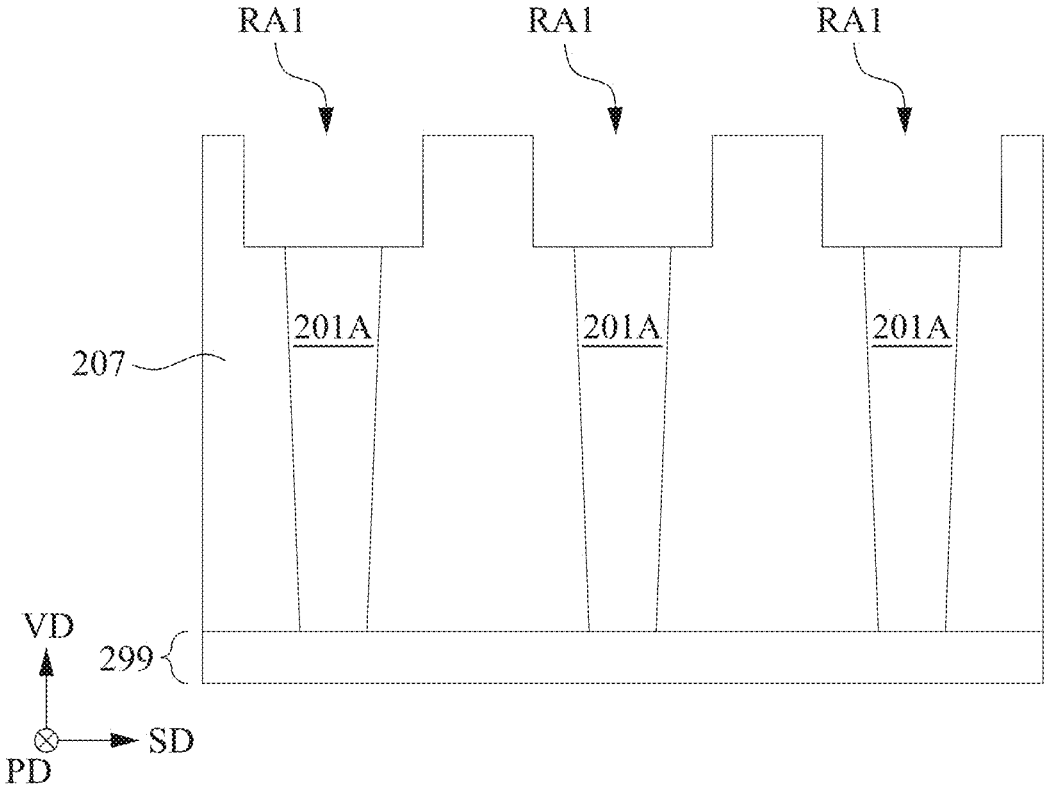

Referring to FIG. 7B, FIG. 7B is a cross sectional view of a semiconductor structure during intermediate stages of manufacturing operations, according to some embodiments of the present disclosure. A layer of first insulation layer 207 is further disposed over the top surface of the first conductive vias 201A. A thickness TH1 of the first insulation layer 207 is greater than the height H1 after the deposition. Referring to FIG. 7C, FIG. 7C is a cross sectional view of a semiconductor structure during intermediate stages of manufacturing operations, according to some embodiments of the present disclosure. A first recess RA1 along the primary direction PD is formed over each of the first conductive vias 201A and in the first insulation layer 207 (such as by patterning and/or etching), and at least a portion of a top surface of the conductive vias 201A is exposed.

Figure 7D:
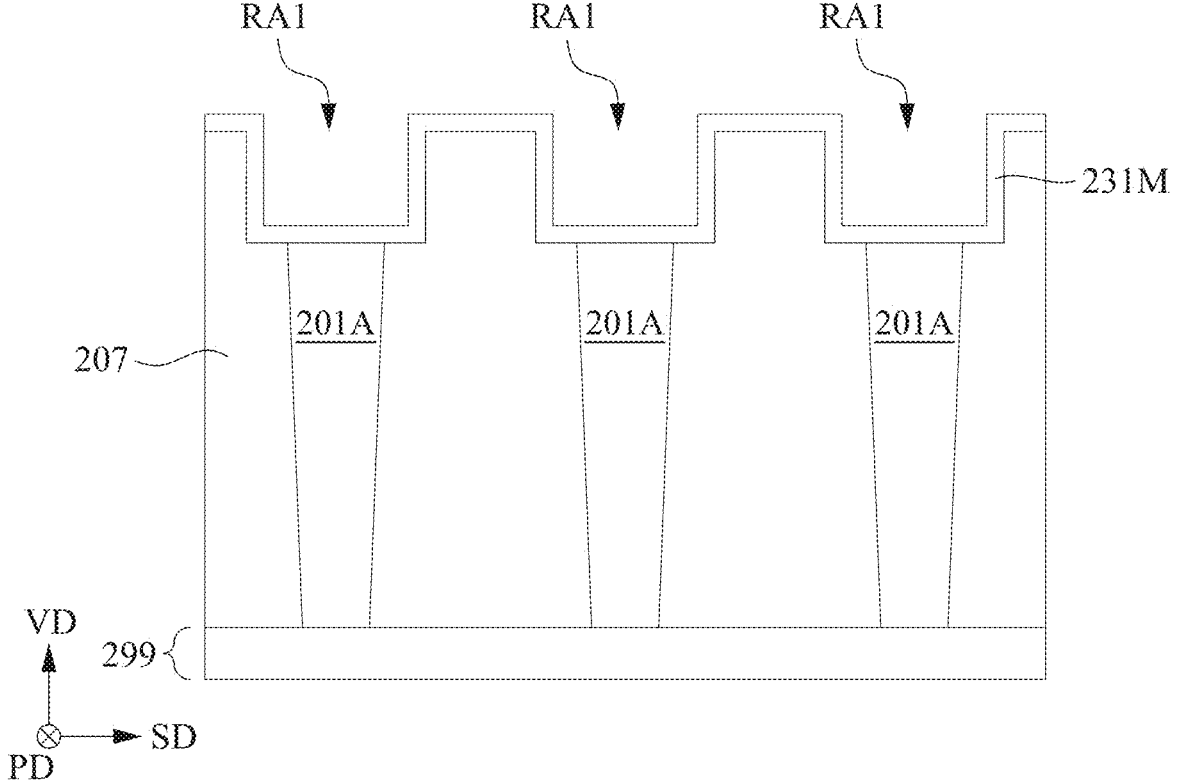

Referring to FIG. 7D, FIG. 7D is a cross sectional view of a semiconductor structure during intermediate stages of manufacturing operations, according to some embodiments of the present disclosure. An insulation material 231M is blanket-deposited over the exposed top surface of the first conductive vias 201A, the sidewall of the first recess RA1, and a top surface of the first insulation layer 207. In some embodiments, the insulation material 231M includes Hi-k material, silicon nitride, nitride-based material, or types of metallic oxide that has high resistivity, or the like.

Figure 7E:
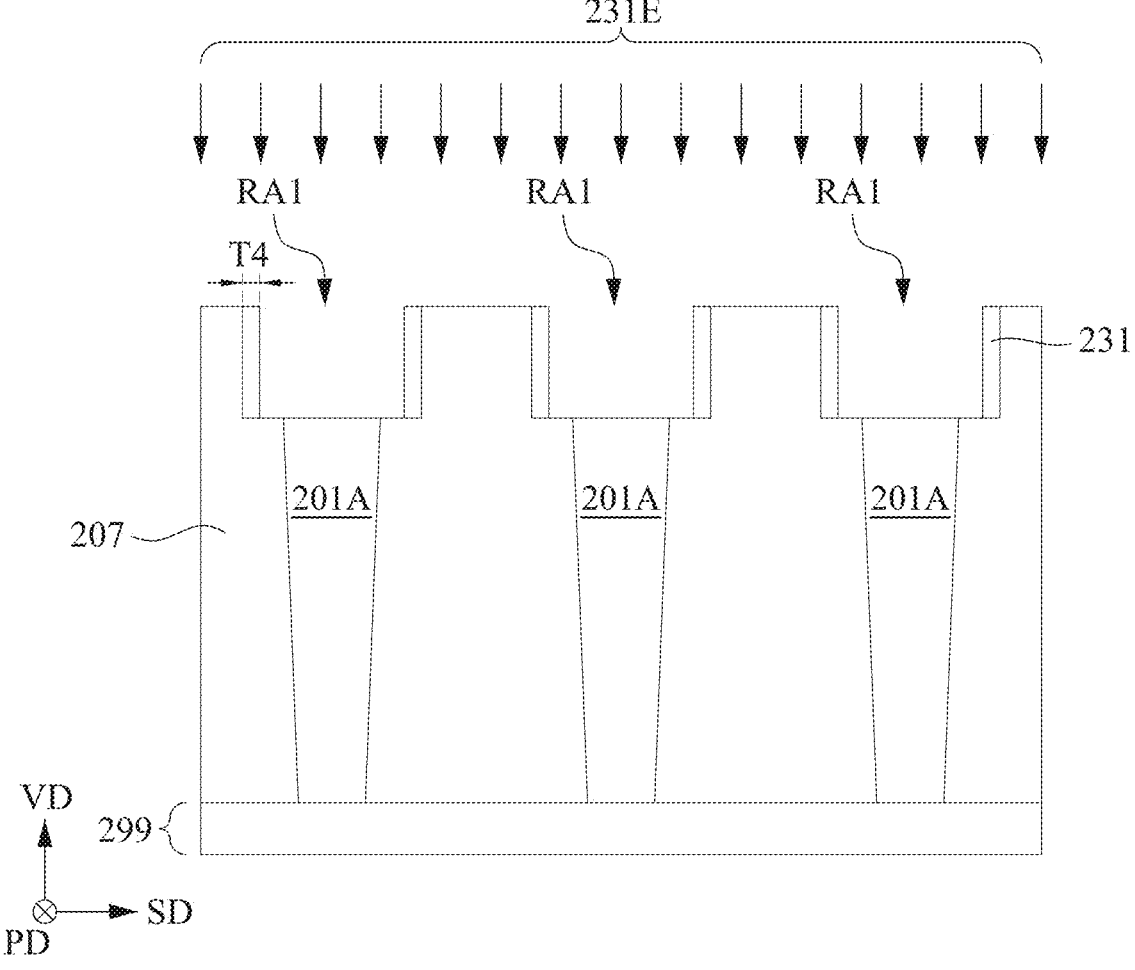

Referring to FIG. 7E, FIG. 7E is a cross sectional view of a semiconductor structure during intermediate stages of manufacturing operations, according to some embodiments of the present disclosure. An etching operation 231E, such as anisotropic dry etching, is performed to remove a portion of the insulation material 231M over the top surface of the first conductive vias 201A and a portion of the insulation material 231M over the top surface of the first insulation layer 207. A portion of the top surface of the first conductive vias 201A is exposed. In some embodiments, at least a portion of the insulation material 231M remains over the sidewall of the first recess RA1, which is referred to as a protection layer 231 in FIG. 7F to FIG. 7J. In some embodiments, a thickness T4 of the protection layer 231 is in a range from about 3 nm to about 7 nm or around one third of a thickness of the metal lines 202A subsequently formed in FIG. 7F. When the thickness T4 of the protection layer 231 is thicker than the aforementioned values, the protection layer 231 may undesirably decrease the space for forming adjacent conductive features and/or increase the overall resistance of the semiconductor device 200'. When the thickness T4 of the protection layer 231 is less than the aforementioned values, the protection layer 231 may not effectively alleviate the issue of electrical short.

Figure 7F:
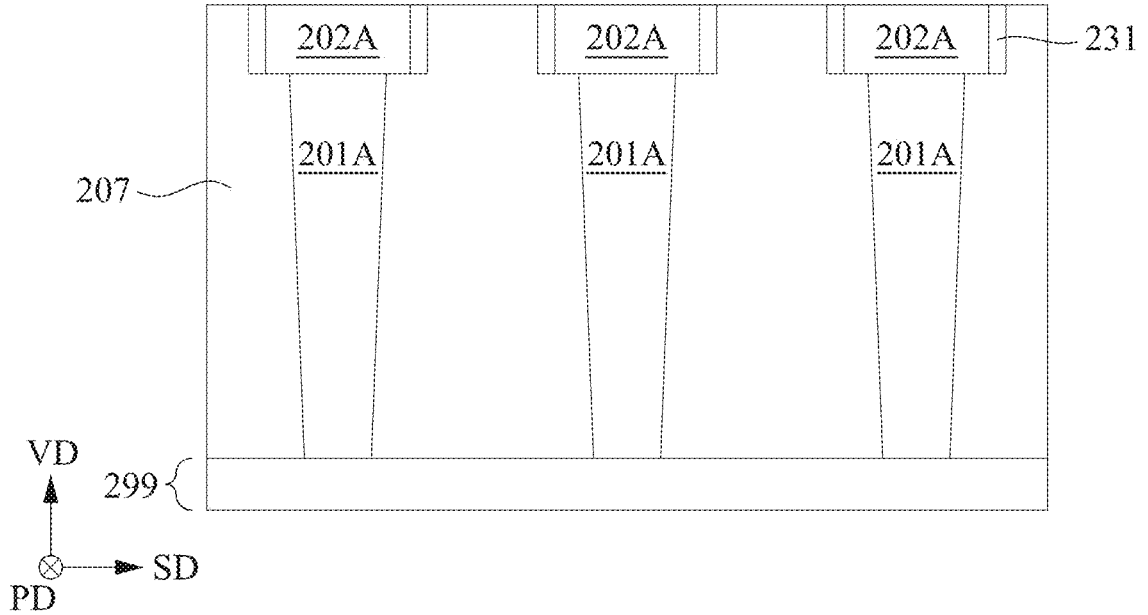

Referring to FIG. 7F, FIG. 7F is a cross sectional view of a semiconductor structure during intermediate stages of manufacturing operations, according to some embodiments of the present disclosure. A first metal line 202A extending along the primary direction PD is formed in the first recess RA1, thereby the protection layer 231 is lining the sidewall of the first metal line 202A. In some embodiments, a material of the first metal lines 202A includes ruthenium (Ru), aluminum (Al), copper (Cu), tungsten (W), or other conductive materials. In some embodiments, a planarization operation, such as CMP operation, is performed to remove excessive material of the first metal lines 202A.

Figure 7G:
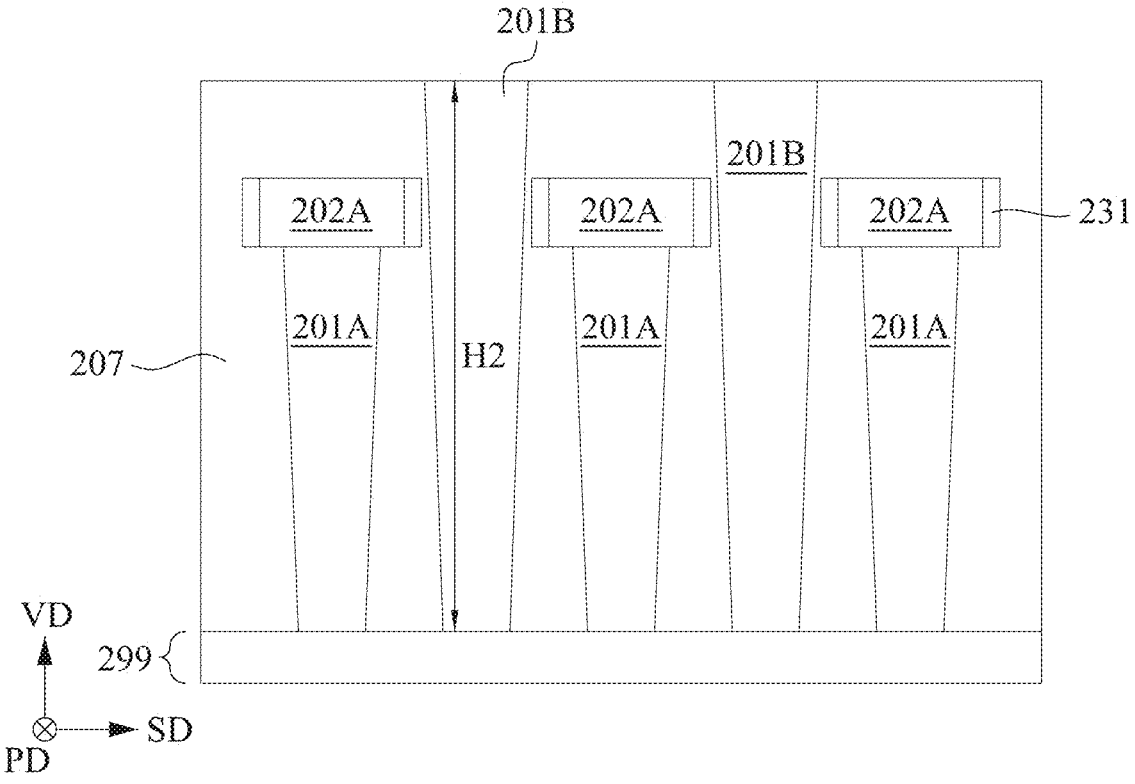

Referring to FIG. 7G, FIG. 7G is a cross sectional view of a semiconductor structure during intermediate stages of manufacturing operations, according to some embodiments of the present disclosure. A layer of first insulation layer 207 is further disposed over the top surface of the first metal line 202A, and one or more second conductive vias 201B are formed in the first insulation layer 207. The presence of protection layer 231 allows the second conductive vias 201B to be free from being in direct contact with the conductive portion of the first metal line 202A during the fabrication operations. In some embodiments, a planarization operation, such as CMP operation, is performed to remove excessive material of the second conductive vias 201B. The planarization operation stops while a top surface of the second conductive vias 201B is above the top surface of the first metal line 202A, so that a height H2 of the second conductive vias 201B is greater than the height H1 (shown in FIG. 7A to FIG. 7B) after the planarization operation, for example, height H2 is in a range from about 30 nm to about 40 nm. (Evidence of criticality of height H2 is previously discussed in FIG. 4A to FIG. 4B) In some embodiments, a bottom surface of the second conductive vias 201B is level with a bottom surface of the first conductive vias 201A. In some embodiments, as discussed in FIG. 4A and FIG. 4B, the second conductive vias 201B is between the protection layers 231 lining two adjacent first metal lines 202A. In some alternative embodiments, as discussed in FIG. 5A and FIG. 5B, due to overlay shift issue or the limit of precision, some of the second conductive vias 201B are in direct contact with a sidewall of the protection layer 231. In some embodiments, the second conductive vias 201B are in direct contact with a portion of the top surface of the protection layer 231.

Figure 7H:
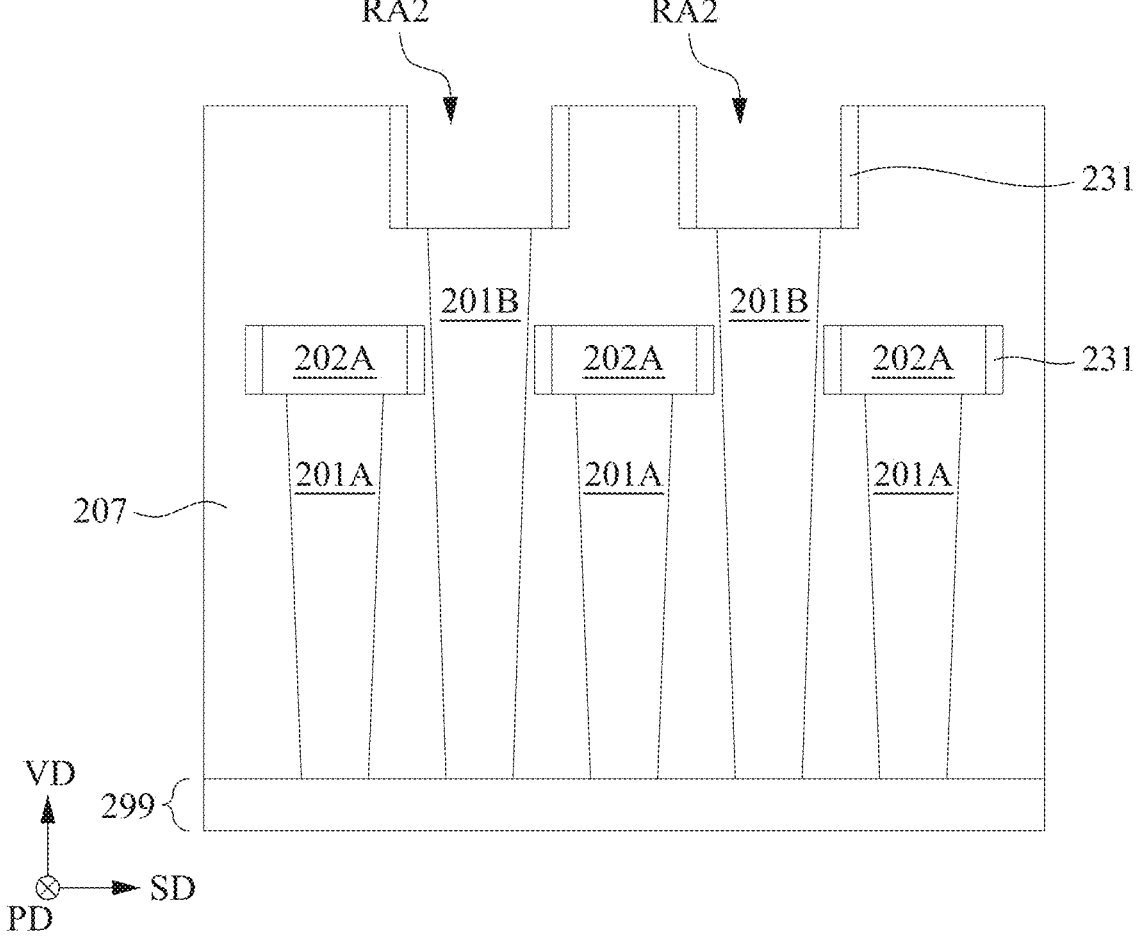

Referring to FIG. 7H, FIG. 7H is a cross sectional view of a semiconductor structure during intermediate stages of manufacturing operations, according to some embodiments of the present disclosure. A layer of first insulation layer 207 is further disposed over the top surface of the second conductive vias 201B, and a second recess RA2 along the primary direction PD is further formed above the second conductive vias 201B, such as by patterning and/or etching. Similar to the operations discussed in FIG. 7C to FIG. 7E, a protection layer 231 lining the sidewall of the second recess RA2 is formed.

Figure 7I:
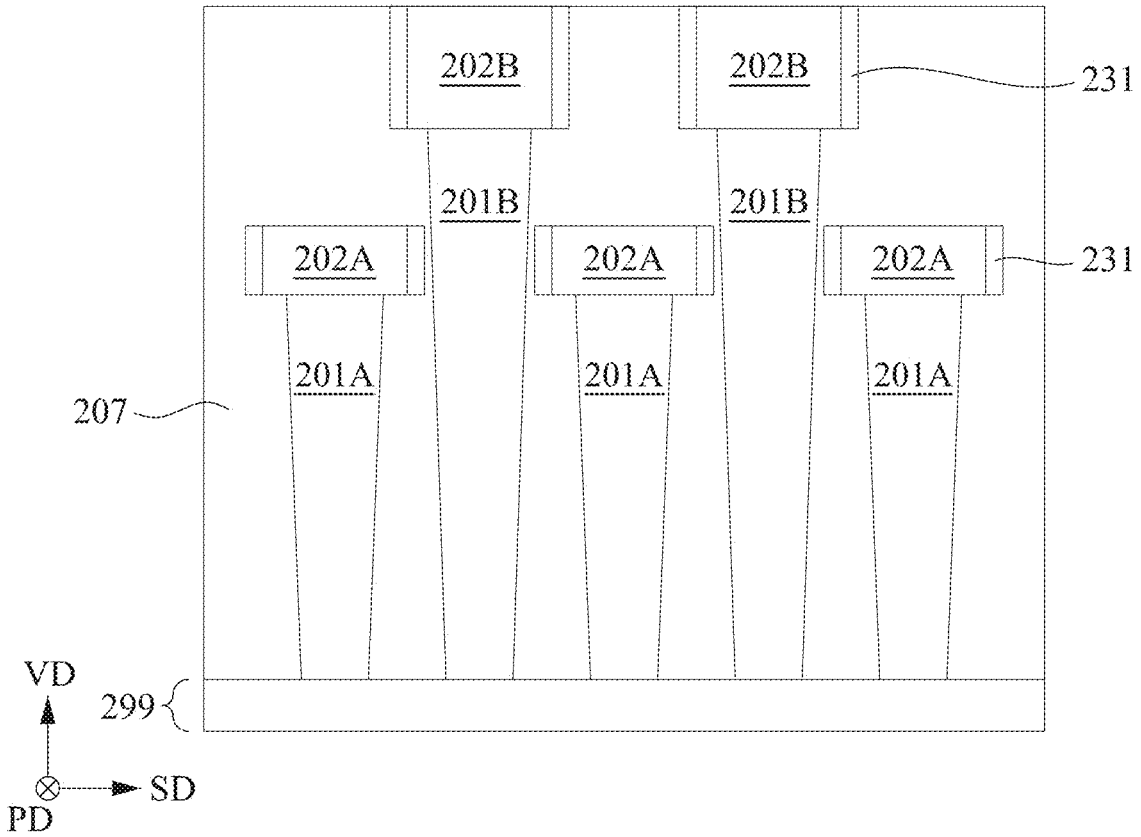

Referring to FIG. 7I, FIG. 7I is a cross sectional view of a semiconductor structure during intermediate stages of manufacturing operations, according to some embodiments of the present disclosure. A second metal line 202B extending along the primary direction PD is formed in each of the second recess RA2. In some embodiments, a material of the second metal lines 202B includes ruthenium (Ru), aluminum (Al), copper (Cu), tungsten (W), or other conductive materials. In some embodiments, a planarization operation, such as CMP operation, is performed to remove excessive material of the second metal lines 202B.

Figure 7J:
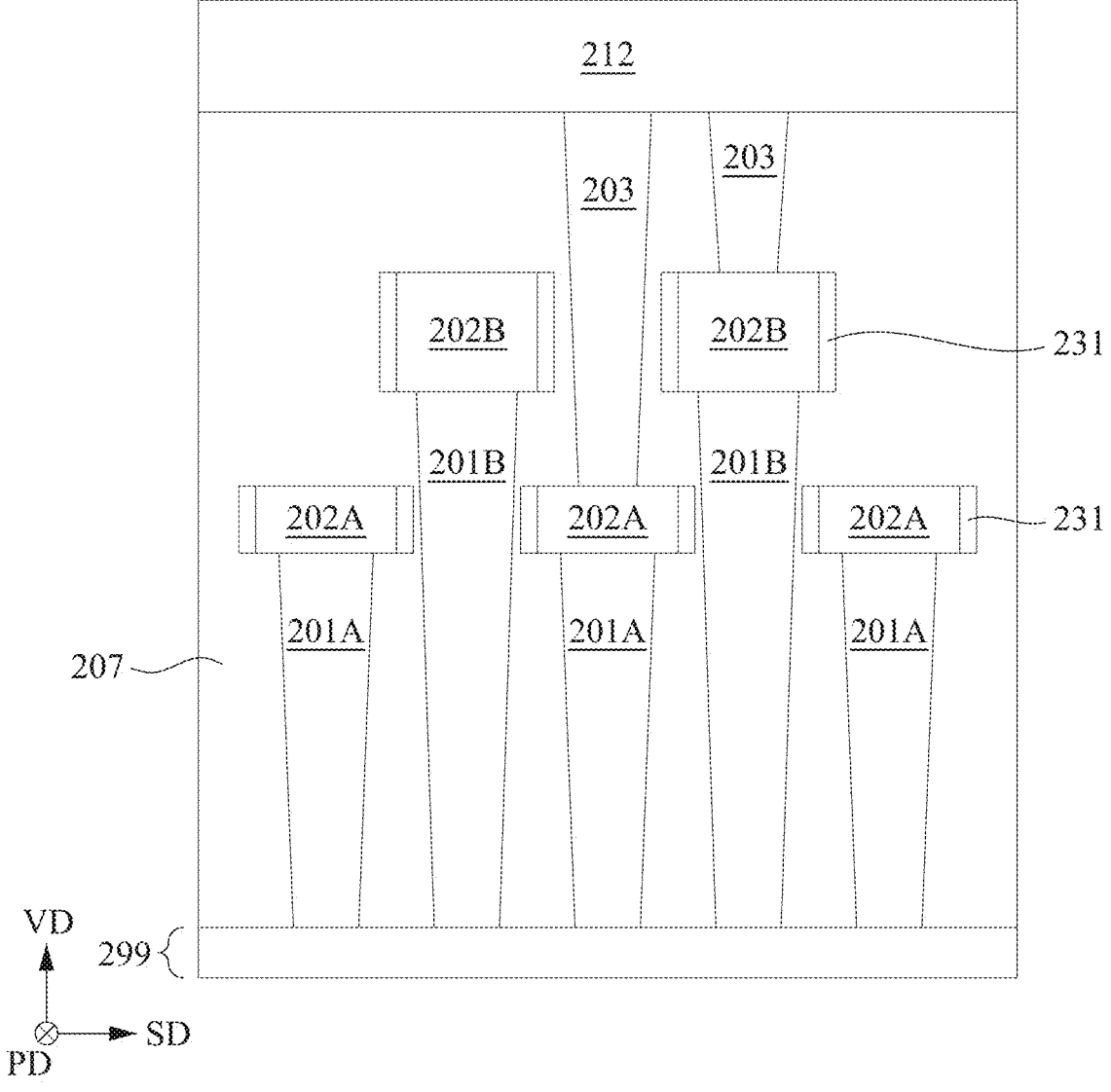

Referring to FIG. 7J, FIG. 7J is a cross sectional view of a semiconductor structure during intermediate stages of manufacturing operations, according to some embodiments of the present disclosure. A layer of first insulation layer 207 is further disposed over the top surface of the second metal line 202B. Third conductive vias 203 are formed over the top surface of the first metal lines 202A and/or the top surface of the second metal lines 202B. In some embodiments, a planarization operation, such as CMP operation, is performed to remove excessive material of the third conductive vias 203. In some embodiments, as discussed in FIG. 4A and FIG. 4B, the third conductive vias 203 is between the protection layers 231 lining two adjacent second metal lines 202B. In some alternative embodiments, as discussed in FIG. 5A and FIG. 5B, due to overlay shift issue or the limit of precision, some of the third conductive vias 203 are in direct contact with a sidewall of the protection layer 231. In some embodiments, the third conductive vias 203 are in direct contact with a portion of the top surface of the protection layer 231. A third metal line 212 extending along the secondary direction SD is formed over the third conductive vias 203. Similar operations can be repeated in the metal layers above the third metal line 212, such as the embodiments shown in FIG. 4A to FIG. 5B.

Figure 8A:
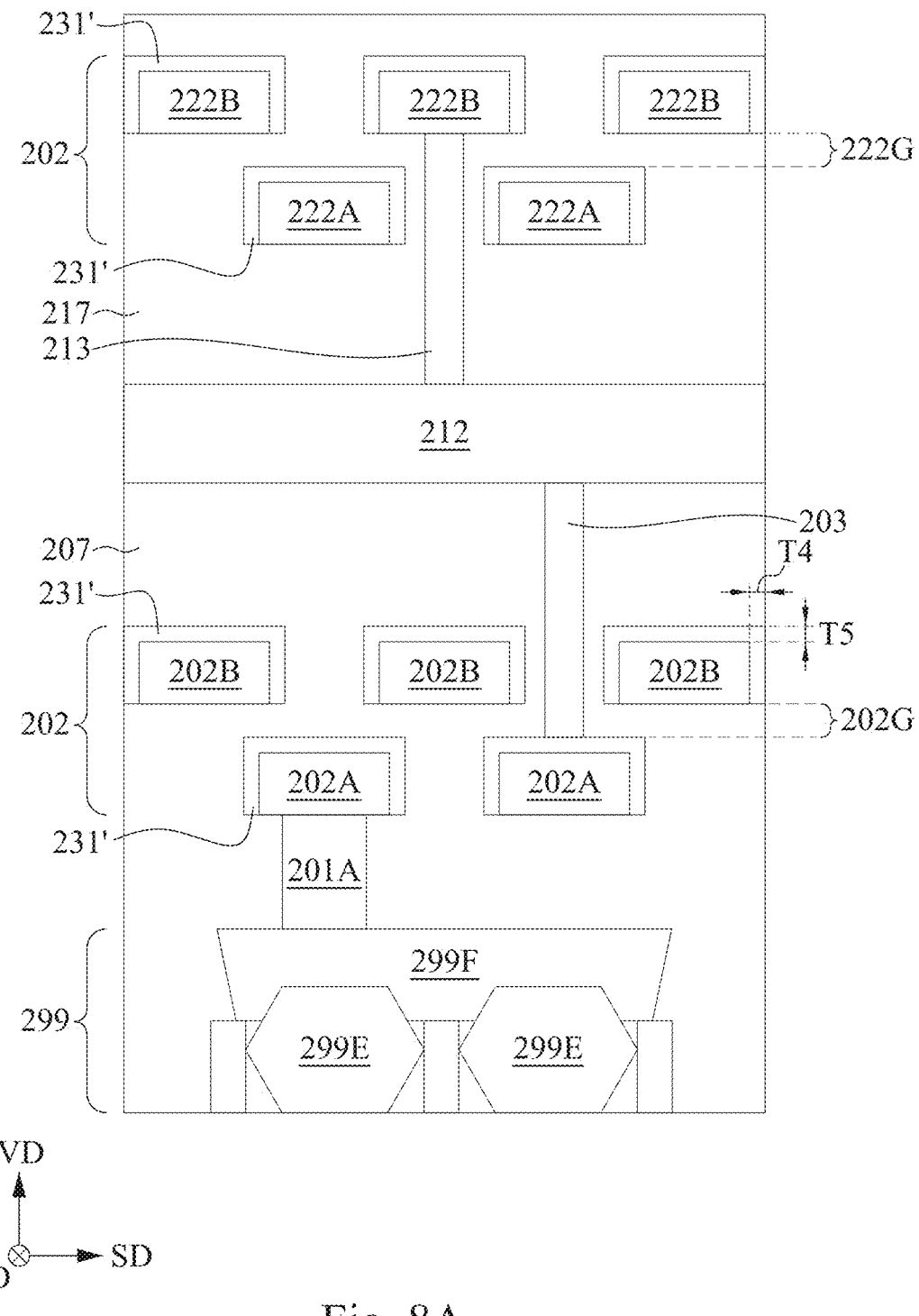
FIG. 8A is a cross sectional view of a semiconductor structure, in accordance with some embodiments of the present disclosure.
Figure 8B:
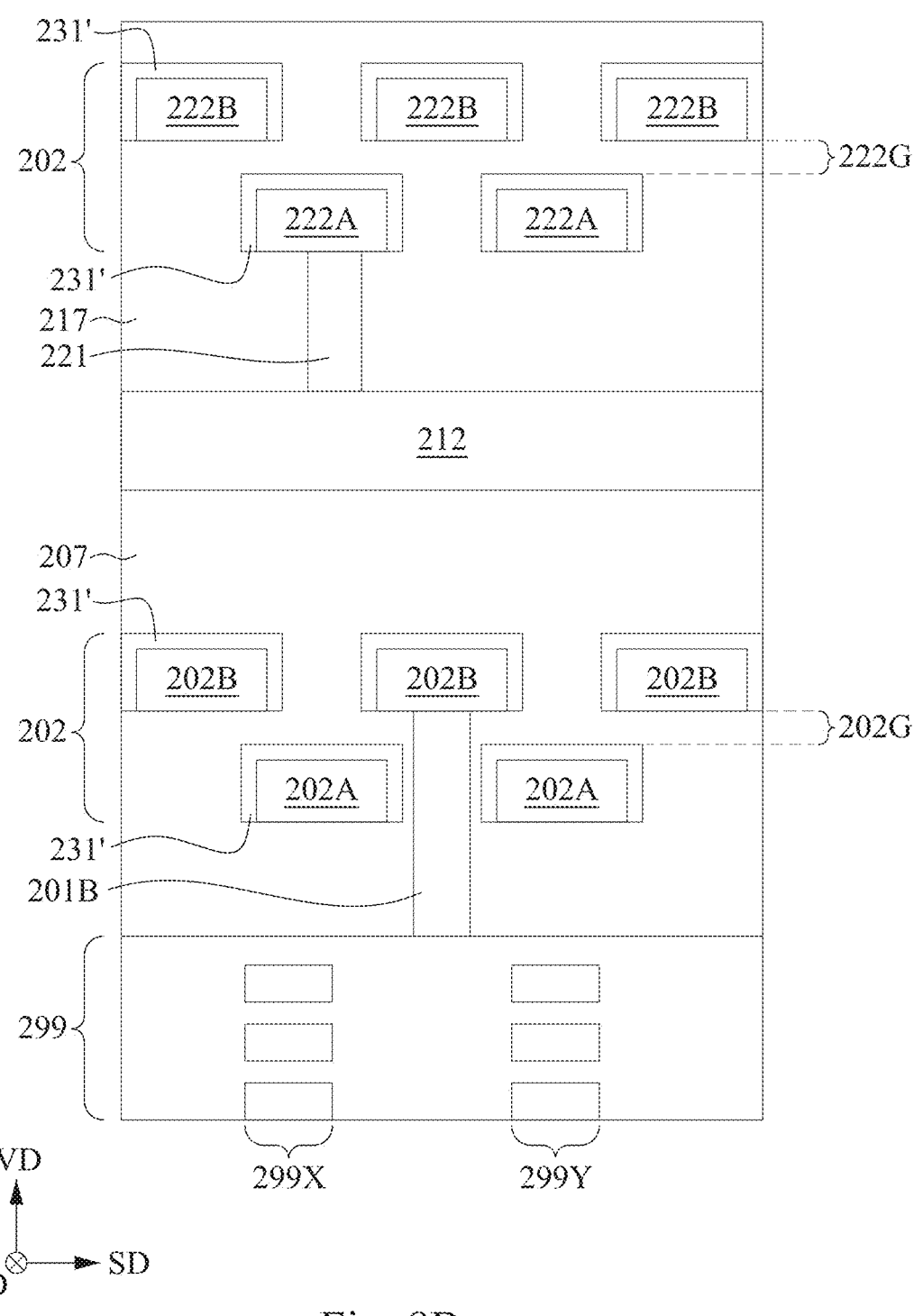
FIG. 8B is a cross sectional view of a semiconductor structure, in accordance with some embodiments of the present disclosure.

Referring to FIG. 8A and FIG. 8B, FIG. 8A is a cross sectional view of a semiconductor structure along a line A-A' in FIG. 3, FIG. 8B is a cross sectional view of a semiconductor structure along a line B-B' in FIG. 3, in accordance with some embodiments of the present disclosure. The semiconductor structure 300 shown in FIG. 8A and FIG. 8B is similar to the semiconductor structure 200 shown in FIG. 4A and FIG. 4B. Differences between the protection layer 231' (shown in FIG. 8A and FIG. 8B) and the protection layer 231 (shown in FIG. 4A to FIG. 4B) reside in that the protection layer 231' further including a top portion covering at least a portion of a top surface of metal lines (such as the first metal lines 202A, second metal lines 202B, fourth metal lines 222A and/or fifth metal lines 222B). The protection layer 231' further improves the protection over the top surface of the metal lines from undesirably being in direct contact with adjacent conductive vias. In some embodiments, a thickness T5 of the top portion of the protection layer 231' is similar to the thickness T4 of the sidewall of the protection layer 231', wherein the trade-off between overall resistance and the electrical short is considered. In some embodiments, the third conductive vias 203 penetrates the top portion of the protection layer 231' and is connected with a top surface of the conductive portion of the first metal lines 202A and/or the top surface of the second metal lines 202B.

Figure 9A:
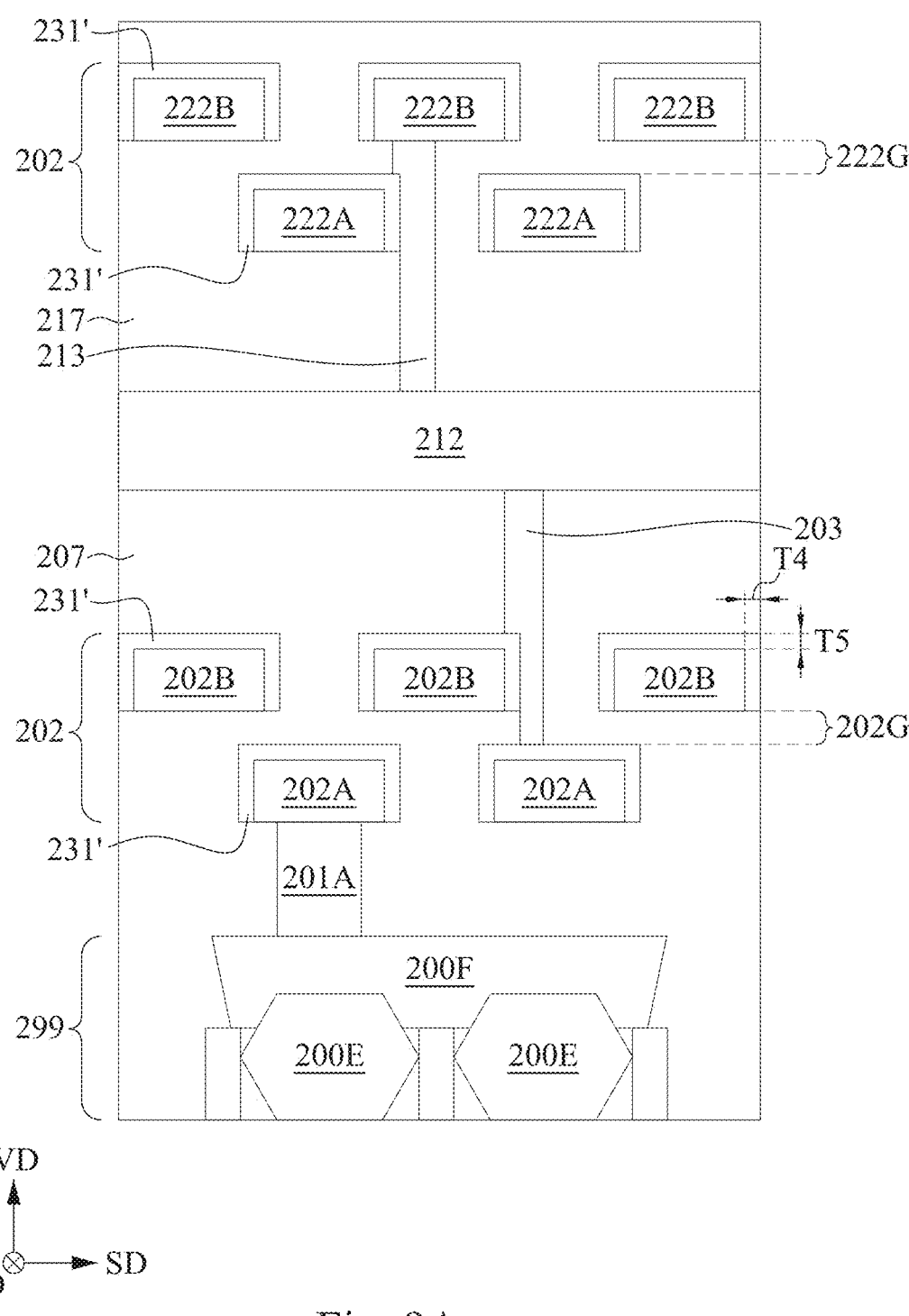
FIG. 9A is a cross sectional view of a semiconductor structure, in accordance with some embodiments of the present disclosure.
Figure 9B:
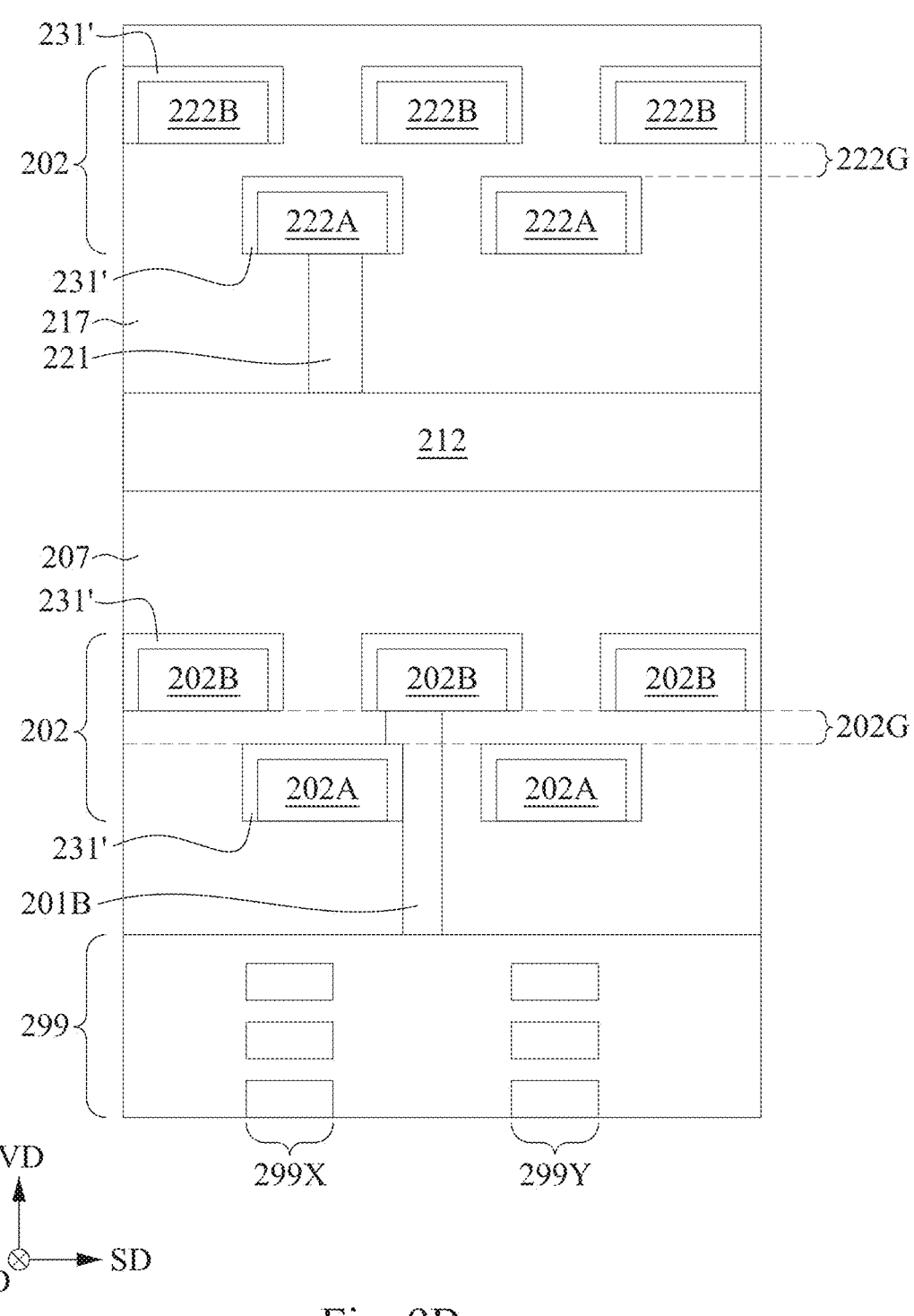
FIG. 9B is a cross sectional view of a semiconductor structure, in accordance with some embodiments of the present disclosure.

Referring to FIG. 9A and FIG. 9B, FIG. 9A is a cross sectional view of a semiconductor structure, FIG. 9B is a cross sectional view of a semiconductor structure, in accordance with some embodiments of the present disclosure. The semiconductor structure 300' shown in FIG. 9A to FIG. 9B is similar to the semiconductor structure 300 shown in FIG. 8A to FIG. 8B. Differences reside in that the protection layer 231 being in direct physical contact with the second conductive via 201B, the third conductive via 203, and/or the third conductive via 213. Specifically, due to overlay shift issue of conductive vias, reduced landing area in advanced technology nodes, and/or other limits with regard to precision of fabrication process, the position of the conductive vias is shifted and thereby having a landing area overlapping with the adjacent metal lines. Thereby the protection layer 231' separates the conductive vias from the conductive portion of metal lines. In some embodiments, at least a portion of a sidewall of the protection layer 231' is in direct contact with the second conductive via 201B, the third conductive via 203, and/or the third conductive via 213. In some embodiments, a portion of a top surface of the protection layer 231' is in direct contact with the second conductive via 201B, the third conductive via 203, and/or the third conductive via 213.

Referring to FIG. 10, FIG. 10 shows a flow chart of a method for fabricating a semiconductor structure, in accordance with some embodiments of the present disclosure. The method 2000 for fabricating a semiconductor device includes providing a substrate (operation 2001, see, for example, FIG. 11A), forming a first insulation material over the substrate (operation 2004, see, for example, FIG. 11A), forming a first conductive via in the first insulation material (operation 2007, see, for example, FIG. 11A), forming the first insulation material over the first conductive via (operation 2013, see, for example, FIG. 11B), forming a first recess over the first conductive via in the first insulation material (operation 2018, see, for example, FIG. 11C), forming a second insulation material lining with a sidewall of the first recess (operation 2024, see, for example, FIG. 11D to FIG. 11E), forming a first metal line in the first recess (operation 2029, see, for example, FIG. 11F), removing a portion of the first metal line (operation 2031, see, for example, FIG. 11G), forming the second insulation material over the first metal line (operation 2033, see, for example, FIG. 11H), forming a second conductive via having a height greater than a height of the first conductive via (operation 2034, see, for example, FIG. 11K), forming a second metal line over the top surface of the second conductive via (operation 2039, see, for example, FIG. 11O), and forming a third metal line over the second metal line (operation 2044, see, for example, FIG. 11S).

One of ordinary skill in the art would understand that although the example each of the first conductive vias 201A and the second conductive vias 201B (et cetera) are presented in one cross section view in FIG. 11A to FIG. 11S, the scope of the present disclosure also includes the embodiments of one or more of aforementioned elements disposed on different positions, which are shown in different cross sections.

Referring to FIG. 11A, FIG. 11A is a cross sectional view of a semiconductor structure during intermediate stages of manufacturing operations, according to some embodiments of the present disclosure. A substrate 299 is provided, wherein the material of the substrate 299 is similar to the previous discussion in FIG. 4A to FIG. 4B. A first insulation layer 207 is formed over the substrate 299. One or more first conductive vias 201A are formed over the substrate 299 and in the first insulation layer 207. In some embodiments, a planarization operation, such as chemical mechanical planarization (CMP) operation, is performed from the top surface of the first insulation layer 207 to remove excessive material of the first conductive vias 201A. After the planarization operation, in some embodiments, a height H1 of the first conductive vias 201A is in a range from about 30 nm to about 40 nm. Evidence of criticality of height H1 is previously discussed in FIG. 4A to FIG. 4B.

Referring to FIG. 11B, FIG. 11B is a cross sectional view of a semiconductor structure during intermediate stages of manufacturing operations, according to some embodiments of the present disclosure. A layer of first insulation layer 207 is further disposed over the top surface of the first conductive vias 201A. A thickness TH1 of the first insulation layer 207 is greater than the height H1 after the deposition. Referring to FIG. 11C, FIG. 11C is a cross sectional view of a semiconductor structure during intermediate stages of manufacturing operations, according to some embodiments of the present disclosure. A first recess RB1 along the primary direction PD is formed over each of the first conductive vias 201A and in the first insulation layer 207 (such as by patterning and/or etching), and at least a portion of a top surface of the conductive vias 201A is exposed.

Referring to FIG. 11D, FIG. 11D is a cross sectional view of a semiconductor structure during intermediate stages of manufacturing operations, according to some embodiments of the present disclosure. An insulation material 231M' is blanket-deposited over the exposed top surface of the first conductive vias 201A, the sidewall of the first recess RB1, and a top surface of the first insulation layer 207. In some embodiments, insulation material 231M' includes Hi-k material, silicon nitride, nitride-based material, or types of metallic oxide that has high resistivity, or the like.

Referring to FIG. 11E, FIG. 11E is a cross sectional view of a semiconductor structure during intermediate stages of manufacturing operations, according to some embodiments of the present disclosure. Similar to the operation in FIG. 7E, an etching operation 231E, such as anisotropic dry etching, is performed to remove a portion of the insulation material 231M' over the top surface of the first conductive vias 201A and a portion of the insulation material 231M' over the top surface of the first insulation layer 207. A portion of the top surface of the first conductive vias 201A is exposed. In some embodiments, at least a portion of the insulation material 231M' remains over the sidewall of the first recess RB1, which is referred to as a protection layer 231' in FIG. 11F to FIG. 11S.

Referring to FIG. 11F, FIG. 11F is a cross sectional view of a semiconductor structure during intermediate stages of manufacturing operations, according to some embodiments of the present disclosure. A first metal line 202A extending along the primary direction PD is formed in the first recess RB1, thereby the protection layer 231' is lining the sidewall of the first metal line 202A. In some embodiments, the first metal lines 202A include ruthenium (Ru), tungsten (W), aluminum (Al), or the like. In some embodiments, a planarization operation, such as CMP operation, is performed to remove excessive material of the first metal lines 202A.

Referring to FIG. 11G, FIG. 11G is a cross sectional view of a semiconductor structure during intermediate stages of manufacturing operations, according to some embodiments of the present disclosure. A portion of the first metal line 202A is removed from the top to form a second recess RB2 along the primary direction PD by an etch back operation. As discussed in FIG. 11F, an etch back operation is easier on materials such as ruthenium (Ru), tungsten (W), aluminum (Al), comparing to some other types of conductive materials.

Referring to FIG. 11H, FIG. 11H is a cross sectional view of a semiconductor structure during intermediate stages of manufacturing operations, according to some embodiments of the present disclosure. An additional layer of the insulation material 231M' is blanket-deposited to be lining with the second recess RB2 and is over the first metal lines 202A and the first insulation layer 207. In some embodiments, the top surface of the insulation material 231M' after blanket deposition is non-uniform.

Referring to FIG. 11I, FIG. 11I is a cross sectional view of a semiconductor structure during intermediate stages of manufacturing operations, according to some embodiments of the present disclosure. In some embodiments, a planarization operation, such as CMP operation, is performed to remove excessive material of the insulation material 231M'.

Referring to FIG. 11J to FIG. 11K, FIG. 11J is a cross sectional view of a semiconductor structure during intermediate stages of manufacturing operations, and FIG. 11K is a cross sectional view of a semiconductor structure during intermediate stages of manufacturing operations, according to some embodiments of the present disclosure. A layer of first insulation layer 207 is further disposed over the top surface of the first metal line 202A, and one or more second conductive vias 201B are formed in the first insulation layer 207. The presence of protection layer 231' allows the second conductive vias 201B to be free from being in direct contact with the conductive portion of the first metal line 202A during the fabrication operations. In some embodiments, a planarization operation, such as CMP operation, is performed to remove excessive material of the second conductive vias 201B. The planarization operation stops while a top surface of the second conductive vias 201B is above the top surface of the first metal line 202A, so that a height H2 of the second conductive vias 201B is greater than the height H1 (shown in FIG. 11A and FIG. 11B) after the planarization operation, for example, height H2 is in a range from about 30 nm to about 40 nm. (Evidence of criticality of height H2 is previously discussed in FIG. 4A to FIG. 4B) In some embodiments, as discussed in FIG. 8A and FIG. 8B, the second conductive vias 201B is between the protection layers 231' lining two adjacent first metal lines 202A. In some alternative embodiments, as discussed in FIG. 9A and FIG. 9B, due to overlay shift issue or the limit of precision, some of the second conductive vias 201B is in direct contact with a sidewall of the protection layer 231'. In some embodiments, the second conductive vias 201B is in direct contact with a portion of a top surface and a sidewall of the protection layer 231'.

Referring to FIG. 11L, FIG. 11L is a cross sectional view of a semiconductor structure during intermediate stages of manufacturing operations, according to some embodiments of the present disclosure. An additional layer of the first insulation layer is formed over the second conductive vias 201B, and a third recess RB3 is formed over each of the second conductive vias 201B.

Referring to FIG. 11M, FIG. 11M is a cross sectional view of a semiconductor structure during intermediate stages of manufacturing operations, according to some embodiments of the present disclosure. The insulation material 231M' is blanket-deposited over the exposed top surface of the second conductive vias 201B, the sidewall of the third recess RB3, and a top surface of the first insulation layer 207.

Referring to FIG. 11N, FIG. 11N is a cross sectional view of a semiconductor structure during intermediate stages of manufacturing operations, according to some embodiments of the present disclosure. Similar to the operation in FIG. 7E and FIG. 11E, an etching operation 231E, such as anisotropic dry etching, is performed to remove a portion of the insulation material 231M' over the top surface of the first conductive vias 201A and a portion of the insulation material 231M' over the top surface of the first insulation layer 207. At least a portion of the insulation material 231M' is remained over the sidewall of the third recess RB3.

Referring to FIG. 11O, FIG. 11O is a cross sectional view of a semiconductor structure during intermediate stages of manufacturing operations, according to some embodiments of the present disclosure. A second metal line 202B extending along the primary direction PD is formed in the third recess RB3, thereby the protection layer 231' is lining the sidewall of the second metal line 202B. In some embodiments, the second metal lines 202B includes ruthenium (Ru), tungsten (W), aluminum (Al), or the like. In some embodiments, a planarization operation, such as CMP operation, is performed to remove excessive material of the second metal lines 202B.

Referring to FIG. 11P, FIG. 11P is a cross sectional view of a semiconductor structure during intermediate stages of manufacturing operations, according to some embodiments of the present disclosure. A portion of the first metal line 202A is removed from the top to form a fourth recess RB4 by an etch back operation.

Referring to FIG. 11Q, FIG. 11Q is a cross sectional view of a semiconductor structure during intermediate stages of manufacturing operations, according to some embodiments of the present disclosure. An additional layer of the insulation material 231M' is blanket-deposited to be lining with the fourth recess RB4 and is over the second metal lines 202B and the first insulation layer 207.

Referring to FIG. 11R, FIG. 11R is a cross sectional view of a semiconductor structure during intermediate stages of manufacturing operations, according to some embodiments of the present disclosure. In some embodiments, a planarization operation, such as CMP operation, is performed to remove excessive material of the insulation material 231M'.

Referring to FIG. 11S, FIG. 11S is a cross sectional view of a semiconductor structure during intermediate stages of manufacturing operations, according to some embodiments of the present disclosure. A layer of first insulation layer 207 is further disposed over the top surface of the second metal line 202B. Third conductive vias 203 can be formed over the top surface of the first metal lines 202A and/or the top surface of the second metal lines 202B. In some embodiments, a planarization operation, such as CMP operation, is performed to remove excessive material of the third conductive vias 203. In some embodiments, as discussed in FIG. 8A and FIG. 8B, the third conductive vias 203 is between the protection layers 231' lining two adjacent second metal lines 202B. In some alternative embodiments, as discussed in FIG. 9A and FIG. 9B, due to overlay shift issue or the limit of precision, some of the third conductive vias 203 are in direct contact with a top surface and a sidewall of the protection layer 231'. A third metal line 212 extending along the secondary direction SD is formed over the third conductive vias 203. In some embodiments, similar operations are repeated in the metal layers above the third metal line 212, such as the embodiments shown in FIG. 8A to FIG. 9B.

Referring to FIG. 12A and FIG. 12B, FIG. 12A is a cross sectional view of a semiconductor structure along a line A-A' in FIG. 3, FIG. 12B is a cross sectional view of a semiconductor structure along a line B-B' in FIG. 3, in accordance with some embodiments of the present disclosure. The semiconductor structure 400 shown in FIG. 12A and FIG. 12B is similar to the semiconductor structure 200 shown in FIG. 4A and FIG. 4B (and semiconductor structure 200' shown in FIG. 5A and FIG. 5B). Differences reside in the relative position and the connection between the first metal lines 202A and the second metal lines 202B (also applicable between fourth metal lines 222A and fifth metal lines 222B). In the embodiments shown in FIG. 4A to FIG. 4B, each of the bottom surface of the second metal lines 202B are free from being directly and physically connected to a top surface of the first metal lines 202A through a conductive path, such as a metal via. Herein in the embodiments shown in FIG. 12A to FIG. 12B, at least one of the second metal line 202B has a bottom surface connected with a top surface of the first metal line 202A through an auxiliary conductive via 204. In some embodiments, one of the second metal line 202B is electrically connected to conductive region 299E with first type conductivity (such as p-type) and another second metal line 202B is electrically connected to conductive region 299E with second type conductivity (such as n-type). Such that one of the second metal line 202B is connected to power voltage and another one of the second metal line 202B is connected to ground voltage. The semiconductor structure 400 is able to be utilized in the technical area of high power semiconductor device, where the power consumption is an issue, thus the factor with regard to the reduction of overall resistance is more dominant, in some instances. Each of the first metal lines 202A is wider than the second metal lines 202B. In some embodiments, in order to reserve landing area of the auxiliary conductive vias 204, the width W1 of the first metal lines 202A along the secondary direction SD is wider than the embodiments shown in FIG. 4A and FIG. 4B. For example, the width W1 is sufficient to form a via landing space for the auxiliary conductive vias 204. Alternatively stated, the vertical overlap between the second metal line 202B and the first metal line 202A should accommodate the width of the auxiliary conductive vias 204. As previously mentioned, the trade-off of relative position/size of the first metal lines 202A and the second metal lines 202B with regard to the overall resistance (which is related to the width W1 of the first metal lines 202A) and the parasitic capacitance (which is related to (1) the vertical distance between the first metal lines 202A and the second metal lines 202B and (2) the total vertically-overlapped area of the first metal lines 202A and the second metal lines 202B) are able to be tuned and adjusted based on the design rule for different types of devices with different application.

The present disclosure provides semiconductor structures that have a staggered vias structures, which utilized metal lines disposed in the same metal layer (i.e., in the same layer of insulation layer) at two or more different height levels, and the metal lines at higher level(s) are partially overlapping with the metal lines at lower level(s), so that the overall device/cell size can be more compact and the device density can be increased. For example, as shown in FIG. 1A to FIG. 2B, the total numbers of metal lines in one cell area are increased even in advanced technology node.

The present disclosure further provides the configurations and methods to help achieve the device size minimization while alleviating electrical short issues by utilizing protection layer 231/231'. The protection layer 231/231' serves as an electrical barrier between conductive portion of the metal lines and a nearby conductive via on lateral side, such that even the landing area of the conductive via is overlapping with a metal line due to overlay shift or similar precision issues, the conductive via is spaced apart from the nearby metal lines, which increases the tolerance of precision of landing area of the conductive vias in advanced technology nodes, especially in BEOL process.

Specifically, in first types of embodiments shown in FIG. 4A to FIG. 7B, the protection layer 231 is utilized to protect the sidewall and/or a peripheral portion of the top surface of the metal lines. A method for forming the protection layer 231 using anisotropic etching that is compatible with the staggered vias structures is also provided. In the second types of embodiments shown in FIG. 8A to FIG. 11S, the protection layer 231' is utilized to protect the sidewall and a top surface of the metal lines. A method for forming the protection layer 231' by further using the etch back operation is provided, wherein ruthenium (Ru), aluminum (Al), tungsten (W) is suitable for such technique among various types of conductive materials. In the third types of embodiments shown in FIG. 12A to FIG. 12B, an auxiliary via 204 is utilized to connect between the metal lines disposed in the same metal layer but at two or more different height levels, and the width of metal lines at lower levels is increased. This configuration helps to further minimize overall device resistance and lower power consumption.

The aforementioned techniques also allow one to adjust the size of each metal lines, relative positions between each metal lines at different levels, the extent of overlapping between metal lines in different levels, thickness of protection layer, et cetera, to adjust the overall resistance and parasite capacitance (or the tradeoff thereof) to comply with design rules tailored for different types of devices that specify specific functions.

An aspect of this description relates to a method of making a semiconductor structure. The method includes defining a first recess in an insulation layer. The method further includes forming a protection layer along a sidewall of the first recess. The method further includes forming a first conductive line in the first recess and in direct contact with the protection layer. The method further includes depositing a first insulation material over the first conductive line. The method further includes defining a second recess in the first insulation material. The method further includes forming a second conductive line in the second recess. The method further includes forming a via extending from the second conductive line, wherein the via directly contacts a sidewall of the protection layer. In some embodiments, defining the second recess includes defining the second recess offset from the first recess in a direction parallel to a top surface of the insulation layer. In some embodiments, forming the via includes electrically connecting the via to a gate electrode of a transistor. In some embodiments, forming the second recess includes forming the second recess having a bottommost surface a first distance above the first conductive line, and the first distance ranges from 6 nanometers (nm) to 15 nm. In some embodiments, forming the first recess includes forming a plurality of first recesses. In some embodiments, forming the second recess includes forming a plurality of second recesses. In some embodiments, forming the protection layer includes forming the protection layer comprising a high-k dielectric material. In some embodiments, forming the first recess includes forming the first recess extending in a first direction, and forming the second recess comprises forming the second recess extending in the first direction. In some embodiments, the method further includes forming a third conductive line above the first insulation material. In some embodiments, forming the third conductive line includes forming the third conductive line extending in a second direction perpendicular to the first direction.

An aspect of this description relates to a method of making a semiconductor structure. The method includes defining a first recess in an insulation layer. The method further includes forming a first conductive line in the first recess. The method further includes depositing a first insulation material over the first conductive line. The method further includes defining a second recess in the first insulation material. The method further includes forming a protection layer along sidewalls of the second recess. The method further includes forming a second conductive line in the second recess and in direct contact with the protection layer. The method further includes depositing a second insulation material over the second conductive line. The method further includes forming a third conductive line over the second conductive line. The method further includes forming a via extending from the third conductive line to the first conductive line, wherein the via directly contacts the protection layer. In some embodiments, the method further includes forming a transistor in a substrate, wherein the insulation layer is over the substrate. In some embodiments, forming the first recess includes forming a plurality of first recesses. In some embodiments, the method further includes forming a fourth conductive line in a second of the plurality of first recesses, wherein forming the first conductive line comprises forming the first conductive line in a first of the plurality of first recesses. In some embodiments, the method further includes forming a second via electrically connecting the fourth conductive line to a gate of the transistor. In some embodiments, defining the second recess includes defining the second recess offset from the first recess in a direction parallel to a top surface of the insulation layer. In some embodiments, forming the via includes forming the via directly contacting a top surface of the protection layer.

An aspect of this description relates to a method of making a semiconductor structure. The method includes depositing an insulation layer over a substrate. The method further includes defining a plurality of first recess in the insulation layer, wherein each of the plurality of first recesses extends in a first direction parallel to a top surface of the substrate. The method further includes forming a plurality of first conductive lines, wherein each of the plurality of first conductive lines is formed in a corresponding first recess of the plurality of first recesses. The method further includes depositing a first insulation material over the plurality of first conductive lines. The method further includes defining a plurality of second recesses in the first insulation material, wherein each of the plurality of second recesses extends in the first direction, and each of the plurality of second recesses is farther from the substrate than each of the plurality of first recesses. The method further includes forming a protection layer along sidewalls of each of the plurality of second recesses. The method further includes depositing a second insulation material over the protection layer. The method further includes forming a second conductive line over the second insulation material, wherein the second conductive line extends in a second direction, and the second direction is perpendicular to the first direction. The method further includes forming a via extending from the second conductive line to a first conductive line of the plurality of first conductive lines, wherein the via directly contacts the protection layer. In some embodiments, the method further includes forming a plurality of third conductive lines, wherein each of the plurality of third conductive lines is formed in a corresponding second recess of the plurality of second recesses. In some embodiments, forming the via includes forming the via extending between adjacent third conductive lines of the plurality of third conductive lines.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of making a semiconductor structure, the method comprising:
   defining a first recess in an insulation layer;
   forming a protection layer along a sidewall of the first recess;
   forming a first conductive line in the first recess and in direct contact with the protection layer;
   depositing a first insulation material over the first conductive line;
   defining a second recess in the first insulation material;
   forming a second conductive line in the second recess; and
   forming a via extending from the second conductive line, wherein the via directly contacts a sidewall of the protection layer at a location between a topmost surface and a bottommost surface of the first conductive line.

2. The method of claim 1, wherein defining the second recess comprises defining the second recess offset from the first recess in a direction parallel to a top surface of the insulation layer.

3. The method of claim 1, wherein forming the via comprises electrically connecting the via to a gate electrode of a transistor.

4. The method of claim 1, wherein forming the second recess comprises forming the second recess having a bottommost surface a first distance above the first conductive line, and the first distance ranges from 6 nanometers (nm) to 15 nm.

5. The method of claim 1, wherein forming the first recess comprises forming a plurality of first recesses.

6. The method of claim 1, wherein forming the second recess comprises forming a plurality of second recesses.

7. The method of claim 1, wherein forming the protection layer comprises forming the protection layer comprising a high-k dielectric material.

8. The method of claim 1, wherein forming the first recess comprises forming the first recess extending in a first direction, and forming the second recess comprises forming the second recess extending in the first direction.

9. The method of claim 8, further comprising forming a third conductive line above the first insulation material.

10. The method of claim 9, wherein forming the third conductive line comprises forming the third conductive line extending in a second direction perpendicular to the first direction.

11. A method of making a semiconductor structure, the method comprising:
   defining a first recess in an insulation layer;
   forming a first conductive line in the first recess;
   depositing a first insulation material over the first conductive line;
   defining a second recess in the first insulation material;
   forming a protection layer along sidewalls of the second recess;
   forming a second conductive line in the second recess and in direct contact with the protection layer;
   depositing a second insulation material over the second conductive line;
   forming a third conductive line over the second conductive line; and
   forming a via extending from the third conductive line to the first conductive line, wherein the via directly contacts the protection layer.

12. The method of claim 11, further comprising forming a transistor in a substrate, wherein the insulation layer is over the substrate.

13. The method of claim 12, wherein forming the first recess comprises forming a plurality of first recesses.

14. The method of claim 13, further comprising forming a fourth conductive line in a second of the plurality of first recesses, wherein forming the first conductive line comprises forming the first conductive line in a first of the plurality of first recesses.

15. The method of claim 14, further comprising forming a second via electrically connecting the fourth conductive line to a gate of the transistor.

16. The method of claim 11, wherein defining the second recess comprises defining the second recess offset from the first recess in a direction parallel to a top surface of the insulation layer.

17. The method of claim 11, wherein forming the via comprises forming the via directly contacting a top surface of the protection layer.

18. A method of making a semiconductor structure, the method comprising:

depositing an insulation layer over a substrate;

defining a plurality of first recess in the insulation layer, wherein each of the plurality of first recesses extends in a first direction parallel to a top surface of the substrate;

forming a plurality of first conductive lines, wherein each of the plurality of first conductive lines is formed in a corresponding first recess of the plurality of first recesses;

depositing a first insulation material over the plurality of first conductive lines;

defining a plurality of second recesses in the first insulation material, wherein each of the plurality of second recesses extends in the first direction, and each of the plurality of second recesses is farther from the substrate than each of the plurality of first recesses;

forming a protection layer along sidewalls of each of the plurality of second recesses;

depositing a second insulation material over the protection layer;

forming a second conductive line over the second insulation material, wherein the second conductive line extends in a second direction, and the second direction is perpendicular to the first direction; and forming a via extending from the second conductive line to a first conductive line of the plurality of first conductive lines, wherein the via directly contacts the protection layer.

19. The method of claim 18, further comprising forming a plurality of third conductive lines, wherein each of the plurality of third conductive lines is formed in a corresponding second recess of the plurality of second recesses.

20. The method of claim 19, wherein forming the via comprises forming the via extending between adjacent third conductive lines of the plurality of third conductive lines.

\* \* \* \* \*